US012581773B2

(12) United States Patent
David

(10) Patent No.: US 12,581,773 B2
(45) Date of Patent: Mar. 17, 2026

(54) INDIUM GALLIUM NITRIDE LIGHT EMITTING DIODES WITH REDUCED STRAIN

(71) Applicant: Google LLC, Mountain View, CA (US)

(72) Inventor: Aurelien Jean Francois David, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 683 days.

(21) Appl. No.: 17/909,191

(22) PCT Filed: Mar. 26, 2021

(86) PCT No.: PCT/US2021/024529
§ 371 (c)(1),
(2) Date: Sep. 2, 2022

(87) PCT Pub. No.: WO2021/195595
PCT Pub. Date: Sep. 30, 2021

(65) Prior Publication Data
US 2023/0155060 A1 May 18, 2023

Related U.S. Application Data

(60) Provisional application No. 63/001,221, filed on Mar. 27, 2020.

(51) Int. Cl.
H10H 20/815 (2025.01)
H10H 20/01 (2025.01)
(Continued)

(52) U.S. Cl.
CPC .... H10H 20/815 (2025.01); H10H 20/01335 (2025.01); H10H 20/018 (2025.01);
(Continued)

(58) Field of Classification Search
CPC ......... H01L 21/02433; H01L 21/02458; H01L 21/02507; H01L 21/0251; H01L 21/02513;
(Continued)

(56) References Cited

U.S. PATENT DOCUMENTS 10,847,625 B1 * 11/2020 Krames ............. H01L 21/02647
2008/0149942 A1 6/2008 Yi et al.
(Continued)

FOREIGN PATENT DOCUMENTS

CN 103190005 A 7/2013
CN 103890243 A 6/2014
(Continued)

OTHER PUBLICATIONS

Internaional Search Report and Written Opinion for PCT Application No. PCT/US2021/024529, mailed on Jul. 12, 2021, 18 pages.

*Primary Examiner* — Matthew C Landau
*Assistant Examiner* — Dmitriy Yemelyanov
(74) *Attorney, Agent, or Firm* — Brake Hughes Bellermann LLP

(57) ABSTRACT

A method of forming an LED emitter includes: providing a III-nitride layer on a substrate (310), the III-nitride layer having a planar top surface; providing discrete lateral growth regions on the top surface; selectively epitaxially growing, on each discrete lateral growth region, a base region (1210) comprising an In(x)Ga(1-x)N material, each extending perpendicular to the top surface; providing surfaces of the In(x)Ga(1-x)N material on portions of the base regions (1210), the surfaces having a relaxed strain and being characterized by a base lattice constant within 0.1% of its bulk relaxed value; and epitaxially growing LED regions on the surfaces, the LED regions including light-emitting layers of In(y)Ga(1-y)N material that are pseudomorphic
(Continued)

with the surfaces of the In(x)Ga(1-x)N material, and characterized by an active region (1240) lattice constant within 0.1% of the base lattice constant, wherein $0.05<x<0.2$ and $y>0.3$.

22 Claims, 23 Drawing Sheets

(51) Int. Cl.

| | |
|---|---|
| *H10H 20/812* | (2025.01) |
| *H10H 20/816* | (2025.01) |
| *H10H 20/821* | (2025.01) |
| *H10H 20/825* | (2025.01) |
| *H10H 20/84* | (2025.01) |
| *H10H 29/14* | (2025.01) |

(52) U.S. Cl.
CPC ...... *H10H 20/812* (2025.01); *H10H 20/8162* (2025.01); *H10H 20/821* (2025.01); *H10H 20/825* (2025.01); *H10H 20/84* (2025.01); *H10H 29/142* (2025.01); *H10H 20/034* (2025.01)

(58) Field of Classification Search
CPC ........... H01L 21/0254; H01L 21/02603; H01L 21/0262; H01L 21/02647; H10H 20/01335; H10H 20/0137; H10H 20/018; H10H 20/034; H10H 20/812; H10H 20/813; H10H 20/815; H10H 20/8162; H10H 20/821; H10H 20/825; H10H 20/84; H10H 29/14
See application file for complete search history.

(56) References Cited

U.S. PATENT DOCUMENTS

| | | | |
|---|---|---|---|
| 2009/0140274 A1 | 6/2009 | Wierer et al. | |
| 2014/0131730 A1 | 5/2014 | Keller et al. | |
| 2018/0277713 A1 * | 9/2018 | Ciechonski ...... | H10H 20/01335 |
| 2019/0088820 A1 * | 3/2019 | Danesh ................. | H01L 25/13 |

FOREIGN PATENT DOCUMENTS

| | | | |
|---|---|---|---|
| JP | 2007311619 A | 11/2007 | |
| JP | 2010514191 A | 4/2010 | |
| JP | 2011187977 A | 9/2011 | |
| JP | 2011254078 A | 12/2011 | |
| JP | 2013545307 A | 12/2013 | |
| JP | 2014090169 A | 5/2014 | |
| JP | 2016025357 A | 2/2016 | |
| WO | 2012059837 A1 | 5/2012 | |
| WO | WO-2019066936 A1 * | 4/2019 | |
| WO | 2019199946 A1 | 10/2019 | |
| WO | 2020008200 A1 | 1/2020 | |

* cited by examiner

200

| | |
|---|---|
| p++ GaN | 290 |
| p GaN | 280 |
| AlGaN EBL | 270 |
| GaN spacer | 260 |
| In0.2GaN QW | |
| GaN barrier | |
| In0.2GaN QW | 250 |
| GaN barrier | |
| In0.2GaN QW | |
| GaN spacer | 240 |
| GaN/InGaN underlayer | 230 |
| n-GaN | 220 |
| GaN buffer | 210 |

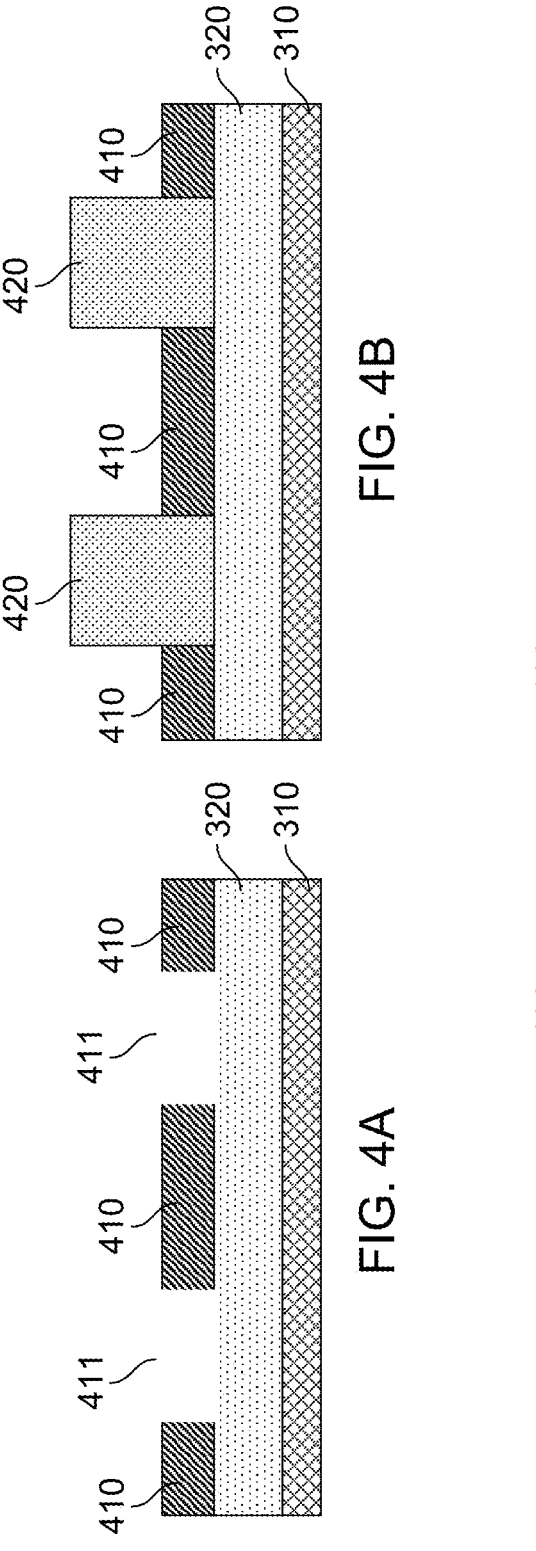
FIG. 4A
FIG. 4B
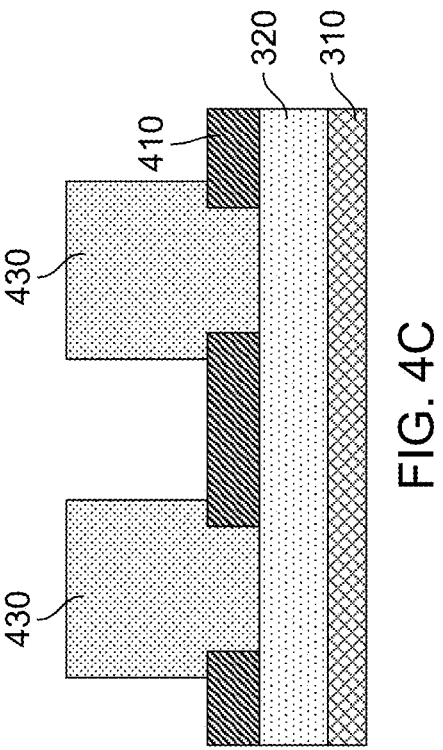
FIG. 4C

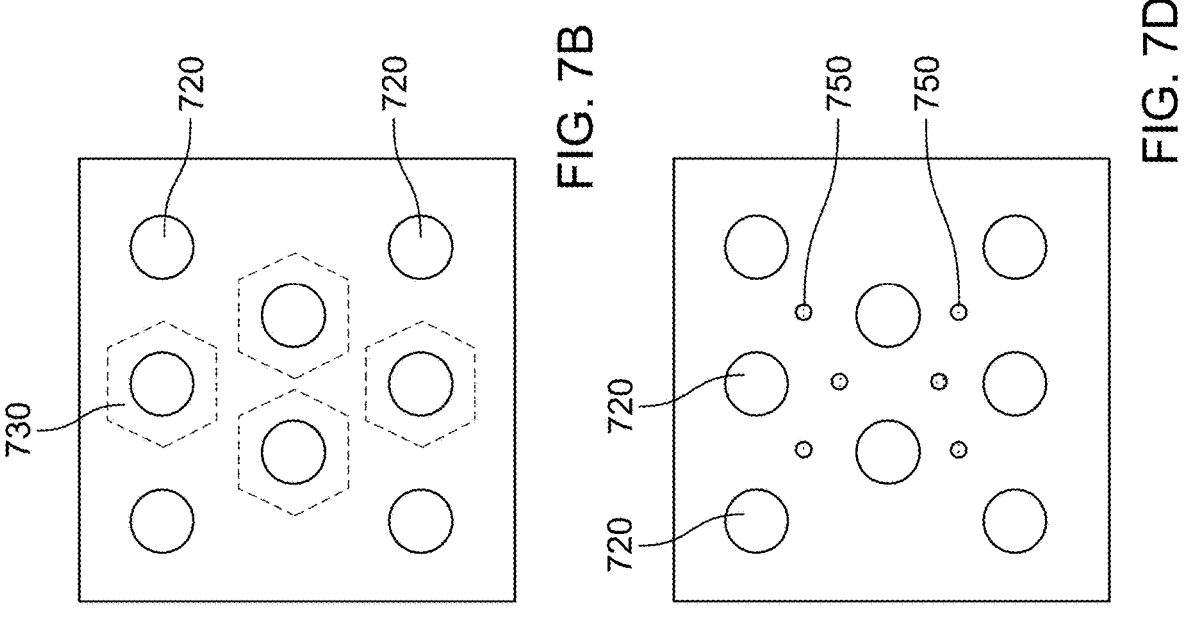
FIG. 7A
FIG. 7B
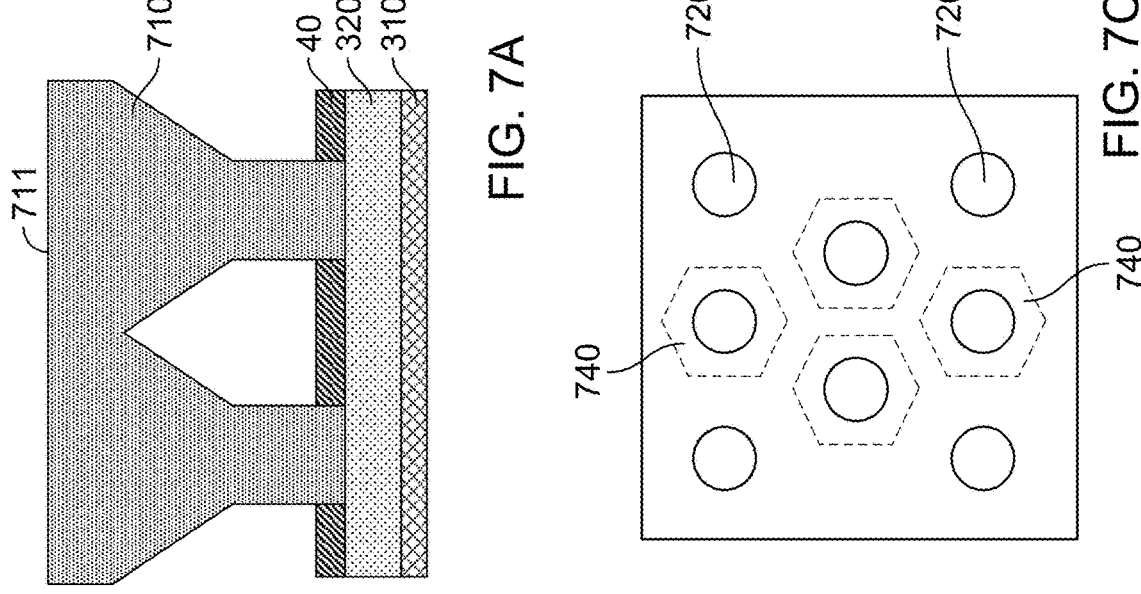
FIG. 7C
FIG. 7D

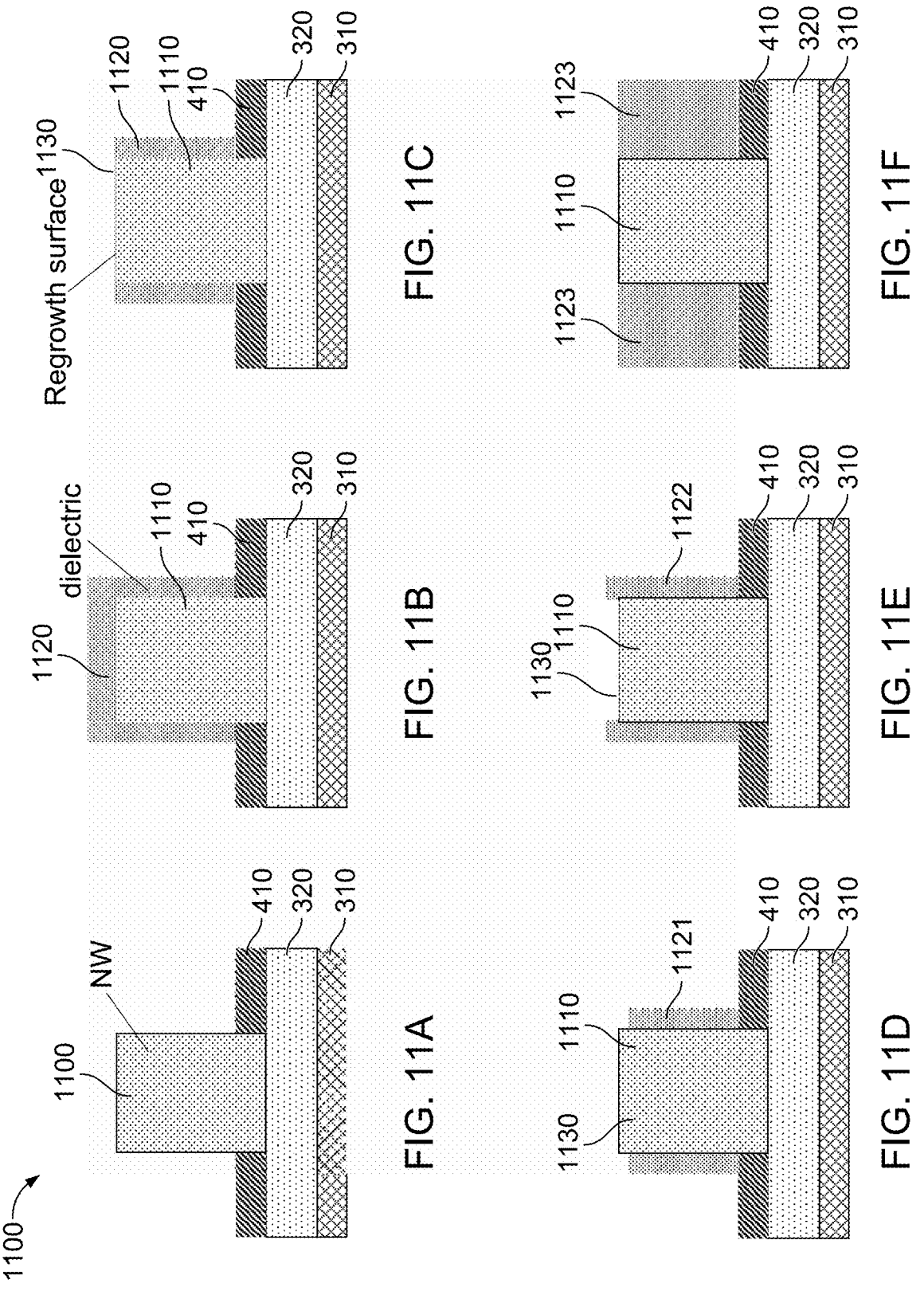

1400

1410

Provide a Substrate

1420

Grow a GaN Buffer On the Substrate

1430

Pattern the Surface of the GaN Buffer

1440

Grow an InGaN Base Region in the Openings of the Pattern by HVPE

1450

Grow an InGaN LED On the Base Region by MOCVD

1460

Process the Sample to form LED Devices

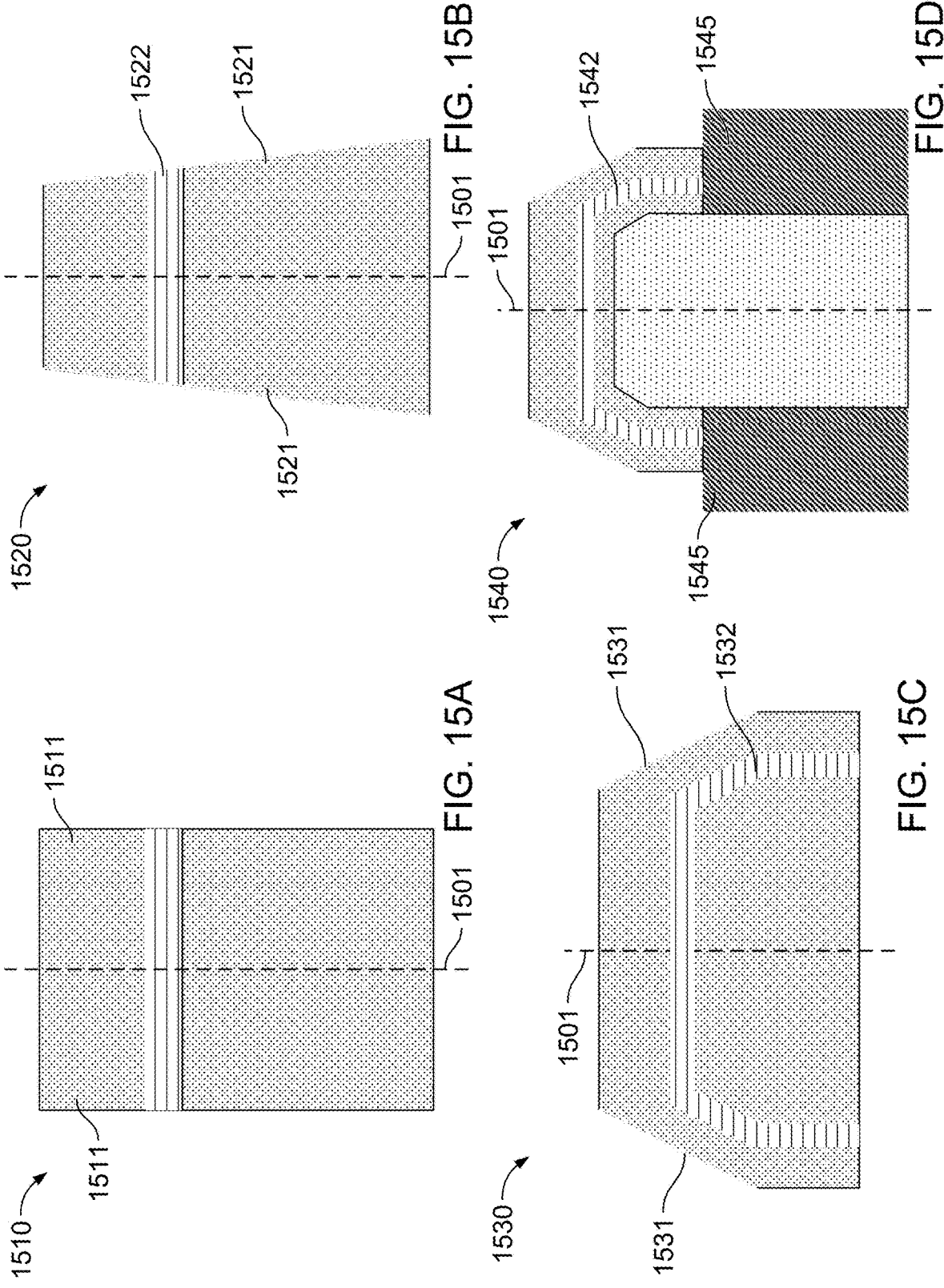

INDIUM GALLIUM NITRIDE LIGHT EMITTING DIODES WITH REDUCED STRAIN

CROSS-REFERENCE TO RELATED APPLICATION

This application is a national phase entry under 35 U.S.C. 371 of PCT Application Serial No. PCT/US2021/024529, filed Mar. 26, 2021, which claims priority to U.S. Provisional Patent Application Ser. No. 63/001,221, filed Mar. 27, 2020. The entirety of each of the foregoing is incorporated herein by reference.

FIELD OF THE DISCLOSURE

The disclosure relates to Indium Gallium Nitride (InGaN) light emitting diodes (LEDs) with reduced strain and devices containing such LEDs.

BACKGROUND

LEDs, such and micro LEDs, are candidates for display applications. In some cases, a combination of III-nitride NE LEDs emitting blue, green, and red radiation is desirable.

SUMMARY

Growing long-wavelength III-nitride light-emitting layers can be challenging for several reasons, including the high amount of defects (point defects, extended defects) which reduces the internal quantum efficiency (IQE) and the difficulty to incorporate a high amount of indium (generally needed for long-wavelength emission). These effects are generally worsened by strain. For example, the strain induced by the lattice difference between the GaN matrix and the InGaN light-emitting layers can lead to defect incorporation/creation, and reduces In incorporation due to lattice pulling.

What is needed is a micro-LED with reduced strain effects for long-wavelength emission.

Various aspects of the invention are summarized as follows.

In general, in a first aspect, the invention features a display emitter including:

three pluralities of sub-regions each corresponding to a sub-pixel of a display, respectively emitting blue, green, and red light during operation of the display emitter, each sub-region including a light emitting region (e.g., plurality of nanowires (NWs), the light emitting region (e.g., each of the NWs) including: a base region having an InGaN composition with at least 5% In, and having a regrowth surface which is relaxed, having a base lattice constant within 0.1% of its bulk value; and an LED region regrown on the regrowth surface, including at least one light-emitting layer having an InGaN composition with at least 10% In. The light-emitting layer is pseudomorphic with the regrowth surface, having an active region lattice constant which is within 0.1% of the base lattice constant.

Embodiments may include one or more of the following features and/or features of other aspects.

The base region can be formed by hydride vapor phase epitaxy (HVPE).

The LED region can be regrown by metal organic chemical vapor deposition (MOCVD).

The base and active region lattice constants can be in-plane lattice constants.

The base region can have a homogeneous composition equal to the InGaN composition.

The NWs can be grown on a planar III-nitride layer.

The base region can include lateral structures with lateral dimensions less than 300 nm, and where relaxation of the base region material occurs within the lateral structures.

In general, in another aspect, the invention features a method of forming a nanowire LED emitter including: providing a substrate; growing a planar GaN layer on the substrate; forming a mask with openings on the substrate; growing In(x)Ga(1-x)N base regions in the openings (e.g., by HVPE), using InCl3 as a precursor, the base regions extending vertically above the openings; providing regrowth surfaces on portions of the base regions, the regrowth surfaces being relaxed, and characterized by a base lattice constant within 0.1% of its bulk relaxed value; and growing LED regions on the regrowth surfaces, the LED regions having light-emitting layers with composition In(y)Ga(1-y)N that are pseudomorphic with the regrowth surfaces, and characterized by an active region lattice constant within 0.1% of the base lattice constant. 0.05<x<0.15 and y>0.2.

Implementations may include one or more of the following features and/or features of other aspects.

In general, in another aspect, the invention features method of forming a nanowire LED emitter, the method including: providing a substrate; forming a mask with openings on the substrate, the mask having a top surface; growing In(x)Ga(1-x)N base material in the openings by a first growth method having first growth parameters which substantially promote lateral growth, the base material extending above the top surface, the base material extending laterally outside of the openings above the top surface; providing at least one regrowth surface on a portion of the base material, the at least one regrowth surface being at least partially relaxed; and growing LED regions on the regrowth surfaces by a second growth method having second growth parameters which do not substantially promote lateral growth, the LED regions having light-emitting layers with composition In(y)Ga(1-y)N that are pseudomorphic with the at least one regrowth surface. 0.05<x<0.2 and y>0.3, and a misfit strain between the light-emitting layer and the regrowth surface is less than half of a misfit strain between the light-emitting layer and relaxed GaN.

Implementations may include one or more of the following features and/or features of other aspects.

The at least one regrowth surface can be characterized by a base in-plane lattice constant within 0.5% of its bulk relaxed value. The first growth parameters can facilitate a growth with a ratio of lateral-to-vertical growth rate of 1 or more (e.g., 2 or more, 5 or more, 10 or more, 100 or more). The second growth parameters facilitate a growth with a ratio of vertical-to-lateral growth rate of 2 or more (e.g., 10 or more, 100 or more). The first method can be HVPE and the second method can be MOCVD.

In general, in a further aspect, the invention features a method of forming a light emitting diode (LED), including: growing a buffer layer comprising Gallium Nitride (GaN) on a surface of a substrate; forming a mask with an opening on a surface of the buffer layer; forming a base layer in the opening on the surface of the buffer layer, wherein forming the base layer includes epitaxially growing In(x)Ga(1-x)N (e.g., using hydride vapor phase epitaxy (HVPE) with a mono-halide or tri-halide precursor); providing a regrowth surface on the base layer, the regrowth surface having a relaxed crystalline structure with a base lattice constant within 0.1% of a bulk value for the base lattice constant for the $In(x)Ga(1-x)N$; epitaxially growing one or more additional layers on the regrowth surface to provide an active region of the LED, the one or more additional layers comprising at least one layer of $In(y)Ga(1-y)N$ that is pseudomorphic with the regrowth surface having an active region lattice constant within 0.1% of the base lattice constant of the regrowth surface; and forming one or more additional layers on the active region and processing the layers to provide the LED. $0.05<x<0.15$ and $y>0.2$.

Implementations may include one or more of the following features and/or features of other aspects. For example, the mask can include multiple spaced-apart openings and the method includes simultaneously forming an LED in each of the openings to provide a plurality of LEDS. The LEDs can be nanowire LEDs (NW LEDS). Each of the plurality of NW LEDS can be configured to emit light at a first peak wavelength, $\lambda_1$, in the visible spectrum. The plurality of NW LEDS can include a first plurality of NW LEDS grouped in a first area of the substrate and the method can further include: forming a second plurality of NW LEDS grouped in a second area of the substrate, each of the second plurality of NW LEDS being configured to emit light at a second peak wavelength, $\lambda_2$, in the visible spectrum; and forming a third plurality of NW LEDS grouped in a third area of the substrate, each of the third plurality of NW LEDS being configured to emit light at a third peak wavelength, $\lambda_3$, in the visible spectrum, wherein $\lambda_1$, $\lambda_2$, and $\lambda_3$ are different from each other.

The opening in the mask can have a first dimension, $d_1$, in a first direction in a plane of the surface of the buffer layer and the regrowth surface has a second dimension, $d_2$, in the first direction, where $d_2>d_1$.

The precursor can be a chloride precursor. The chloride precursor can be selected from the group of $GaCl$, $GaCl_3$, $InCl$ and $InCl_3$.

The layer of GaN can be a planar layer.

The LED can extend perpendicular to the surface of the substrate above the opening.

The substrate can include a substrate material selected from the group of sapphire, silicon, and GaN.

The one or more additional layers can include one or more Quantum Well (QW) layers configured to emit light having a peak wavelength $\lambda$ in a visible part of the electromagnetic spectrum.

The one or more additional layers can be formed using metal organic chemical vapor deposition (MOCVD) or molecular beam epitaxy (MBE).

In general, in a further aspect, the invention features a light emitting device, including: a GaN buffer layer on a surface of a substrate; a light emitting diode (LED) extending from the GaN buffer layer, the LED including: an LED region having at least one layer of $In(y)Ga(1-y)N$; and a base region between the LED region and the GaN buffer layer. The base region includes a layer of $In(x)Ga(1-x)N$ having a regrowth surface, the regrowth surface having a relaxed crystalline structure with a base lattice constant within 0.1% of a bulk value for the base lattice constant for the $In(x)Ga(1-x)N$. The layer of $In(y)Ga(1-y)N$ in the LED region is pseudomorphic with the regrowth surface and has an active region lattice constant within 0.1% of the base lattice constant of the regrowth surface, and $0.05<x<0.15$ and $y>0.2$.

Embodiments may include one or more of the following features and/or features of other aspects. For example, the LED region can include an active region having one or more Quantum Well (QW) layers supported by the layer of $In(y)Ga(1-y)N$. The LED region further can include a second InGaN layer supported by the active region.

At the surface of the buffer layer, the base region can have a first dimension, $d_1$, in a first direction in a plane of the surface of the buffer layer and the regrowth surface can have a second dimension, $d_2$, in the first direction, where $d_2>d_1$.

The light emitting device can include a mask on the surface of the buffer layer, wherein the NW LED is formed in an aperture in the mask.

The layer of $In(x)Ga(1-x)N$ in the base region can be formed using hydride vapor phase epitaxy (HVPE) with a mono-halide or tri-halide precursor.

The layer of $In(y)Ga(1-y)N$ in the LED region can be formed using metal organic chemical vapor deposition (MOCVD) or molecular beam epitaxy (MBE).

In another aspect, the invention features a display device, including a plurality of the NW LEDS, each of the NW LEDS extending from the GaN buffer layer, the NW LEDS being spaced apart from one another. Each of the plurality of NW LEDS can be configured to emit light at a first peak wavelength, $\lambda_1$, in the visible spectrum. The plurality of NW LEDS include a first plurality of NW LEDS grouped in a first area of the substrate, the display device further including: a second plurality of NW LEDS grouped in a second area of the substrate, each of the second plurality of NW LEDS being configured to emit light at a second peak wavelength, $\lambda_2$, in the visible spectrum; and a third plurality of NW LEDS grouped in a third area of the substrate, each of the third plurality of NW LEDS being configured to emit light at a third peak wavelength, $\lambda_3$, in the visible spectrum. $\lambda_1$, $\lambda_2$, and $\lambda_3$ are different from each other and the first, second and third areas constitute a single pixel of the display device.

In general, in a further aspect, the invention features a method of forming a light emitting diode (LED), the method including: providing a growth substrate having a textured top surface; selectively growing, with a first growth technique, a first base material on regions of the top surface, to form features with at least one lateral dimension less than 500 nm, the first base material comprising an $In(x)Ga(1-x)N$ layer which is relaxed; growing, with a second growth technique, a second base material over the first base material, the growth of the second base material extending the at least one lateral dimension of the features to more than 1 micron, the second base material including a layer of $In(x)Ga(1-x)N$ which is relaxed, the second growth technique favoring lateral growth over vertical growth; and growing, with a third growth technique, an LED structure over the features, the LED structure including at least one light-emitting layer of $In(y)Ga(1-y)N$ which is pseudomorphic with the second base material, the third growth technique favoring vertical growth over lateral growth. $0.05<x<0.2$ and $y>0.3$, and a misfit strain between the light-emitting layer and the second base material is less than half of a misfit strain between the light-emitting layer and relaxed GaN.

Implementations may include one or more of the following features and/or features of other aspects. For example, the textured top surface of the growth substrate includes a planar surface covered with a mask having openings with lateral dimensions less than 500 nm, and the selective growth occurs in the openings.

The features can be mesas.

The first and second base materials can have in-plane lattice constants within 0.5% of their respective unstrained equilibrium values.

The light emitting layer can be planar and can have a wurtzite crystalline structure, and the plane of the light emitting layer can be along a c-plane of the wurtzite structure.

The features can have an average dislocation density less than 1E7 cm$^{-1}$.

The first and second growth techniques can be hydride vapor phase epitaxy (HVPE) and the third growth technique can be metal organic chemical vapor deposition (MOCVD).

The first growth technique can be HVPE and the second and third growth techniques can be MOCVD.

The method can include, after the growth of the second base material and before the growth of the LED structure, preparing a surface of the features to facilitate the growth of the LED structure.

One or more advantages will be apparent from the disclosure, the figures, and the claims.

BRIEF DESCRIPTION OF THE DRAWINGS

FIGS. 4A-4C show steps another example process flow to fabricate a base region having lateral structures.

FIG. 7A is a cross-sectional diagram showing an example LED emitter.

FIGS. 7B-7D are plan views showing mask openings for growing the example LED emitter shown in FIG. 7A.

FIGS. 11A-11F are cross-sectional diagrams showing steps in an example process flow to cover LED emitter sidewalls.

FIGS. 15A-15D are cross-sectional diagrams showing further example embodiments of LED emitters.

6

FIGS. 19A-19G are cross-sectional diagrams showing steps in another example process for forming LED emitters.

DETAILED DESCRIPTION

LED Structure

Some embodiments disclosed herein are nanowire (NW) LEDs, where each LED includes one or several NWs. The NW has a base region which includes an InGaN layer, and an LED region which includes n-doped layers, an active region (light-emitting region) having at least one light-emitting InGaN layer, and p-doped layers. The base region may be grown by a first technique, such as HVPE. The LED region may be regrown on the base region by a second technique, such as MOCVD or MBE.

Figures 1A, 1B:
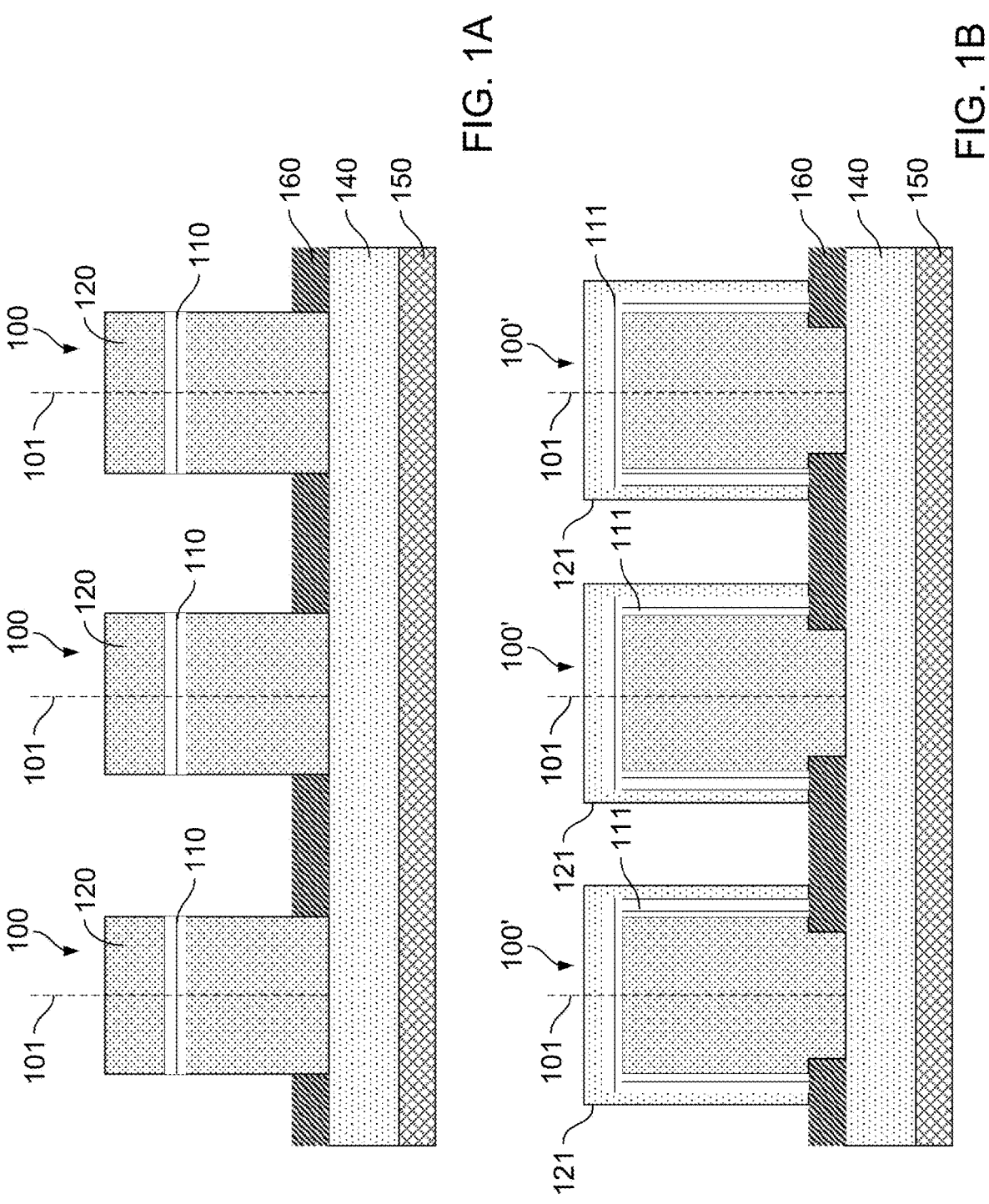
FIG. 1A and FIG. 1B are cross-sectional diagrams of example LED emitters.

FIGS. 1A-1B show examples of such LEDs 100 and 100', respectively. In FIG. 1A, the active regions 110 are planar and are grown perpendicular to the respective NW axes 101. In FIG. 1B, the active regions 111 and p-GaN layers 121 are conformal with the base NW (this is termed a core-shell structure). In both examples, the NWs 100 and 101 include an n-InGaN layer 130 grown on a GaN layer 140 on a substrate 150. A mask layer 160 is supported on GaN layer 140 and includes apertures in which the NWs are formed. The shape of the NW need not be vertical—it may have slanted sidewall; a core-shell structure may have an active region along various facets (including horizontal, vertical, slanted).

The base region may have a suitable strain state; it may be fully or partially relaxed. The base region serves as a base for the growth of the epitaxial layers of the LED region. Some embodiments contrast with conventional LEDs in that they contain higher concentrations of In in various layers surrounding the light-emitting layers, to reduce the strain of the light-emitting layers.

Figure 2A:
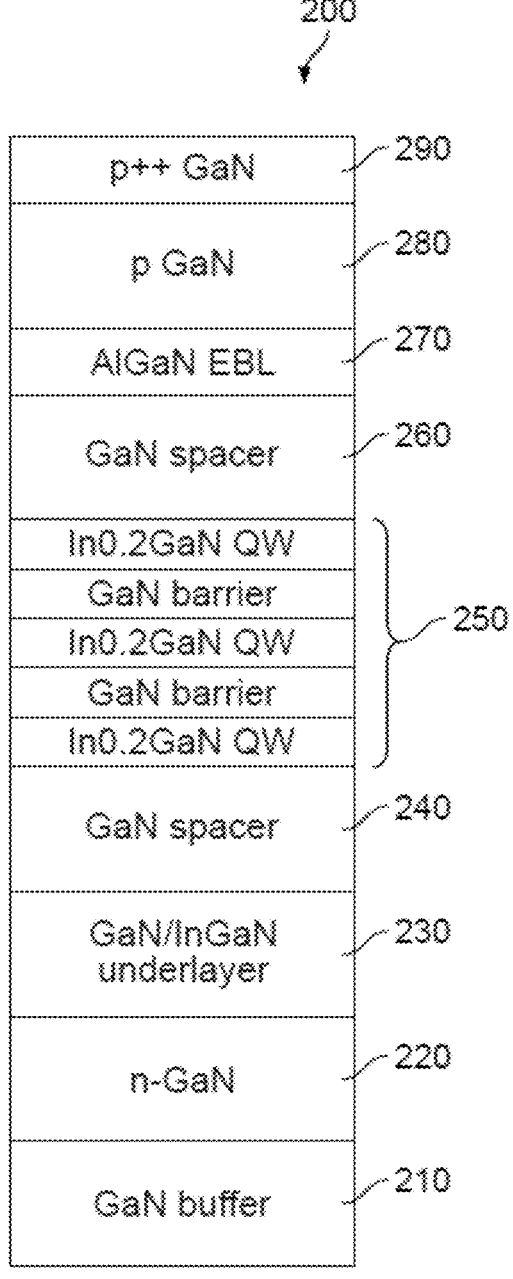
FIGS. 2A and 2B are cross-sectional diagrams of example LED emitters showing composition of different layers.
Figure 2B:
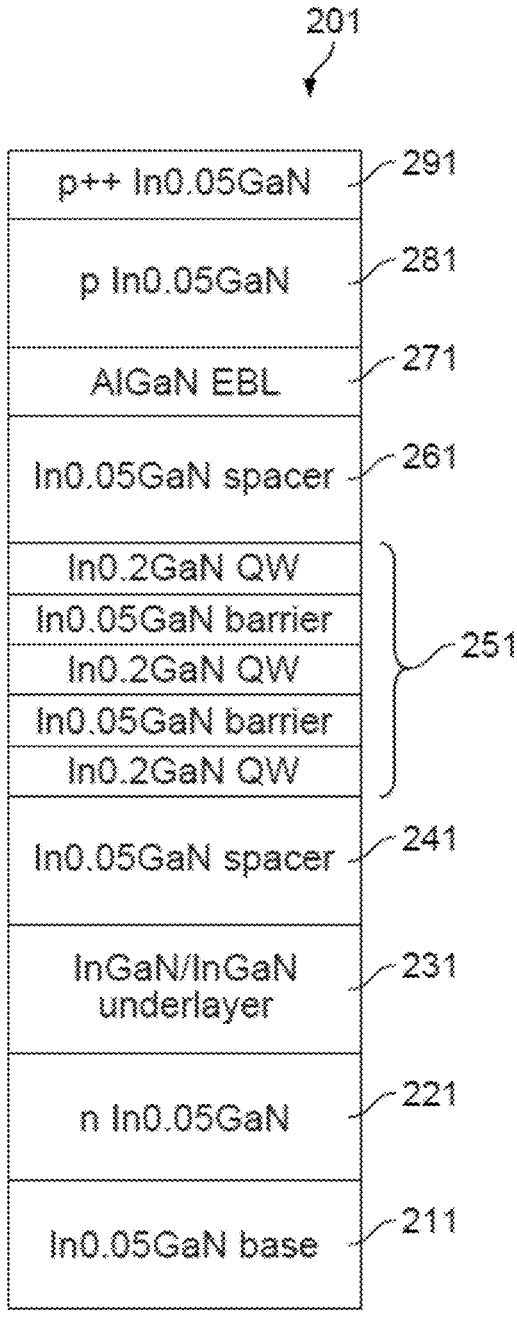

FIGS. 2A-2B contrast a conventional LED epitaxial stack 200 and an embodiment 201. In FIG. 2A, most of the layers are GaN. Specifically, the stack of layers forming LED 200 from the base to the top is as followings: a GaN buffer 210, a n-GaN layer 220, a GaN/InGaN underlayer 230, and a GaN spacer 240 which supports active region 250. Active region 250 is composed of In0.2GaN quantum well layers separated by GaN barrier layers. Above the active region 250, the stack includes a GaN spacer 260, an AlGaN EBL 270, a p GaN layer 280, and, finally, a p++ GaN layer 290. The layers are grown on the relaxed GaN buffer 210 and are pseudomorphic to GaN. The In0.2GaN QWs in active region 250 can experience high strain due to their large lattice mismatch with GaN.

In FIG. 2B, the stack forming LED 201 is grown on an In0.05GaN base layer 211 whose surface is relaxed, and has a lattice constant larger than GaN (in the case of full relaxation, the lattice constant is that of bulk In0.05GaN). The LED layers may contain InGaN rather than GaN. They may have the same content as the base region, which yields low strain (although other compositions are possible, including GaN and AlGaN layers). In the example shown in FIG. 2B, the stack grown on base 211 includes, from bottom to top, the following layers below active region 251: In0.05GaN layer 221, InGaN/InGaN underlayer 231, In0.05GaN spacer 241. Above active region 251, the stack includes an In0.05GaN spacer 261, AlGaN EBL 271, a p In0.05GaN layer 281, and a p++ In0.05GaN layer 291. The same In0.2GaN QW in active region 251 sustains a lower strain than in FIG. 2A. This may facilitate higher material quality, and higher performance.

In some embodiments, an LED emitter includes pixels, each pixel having three subpixels (e.g., emitting blue, green and red light). Each subpixel includes nanowire (NW) emitters. The nanowires feature an InGaN base region grown by HVPE, and an InGaN LED region having quantum wells grown by MOCVD. The red nanowires are characterized by an InGaN base region with 5%<[In]<15% having a surface region that is relaxed, and InGaN quantum wells with [In]>20% grown pseudomorphically on the surface region.

At least one layer in an InGaN base region may be substantially relaxed, and have an [In] composition of 50% or less (e.g., 40% or less, 30% or less, 25% or less, 20% or less, 15% or less). In some embodiments, at least one layer in an InGaN base region is substantially relaxed and has an [In] composition of 5% or more (e.g., 7.5% or more, 10% or more, 12.5% or more, 15% or more).

Growth

The growth involves growth of the base region, and growth of the LED region on the base region. These will now be discussed.

Base Region Growth

In some embodiments, the base region of the LED includes a III-nitride region having an In composition.

In general, growth of thick InGaN layers is challenging. It has been shown that InGaN layers of good quality could be grown by Hydride Vapor Phase Epitaxy (HVPE). For instance, tri-halide HVPE (THVPE), which uses InCl3 and/or GaCl3 precursors, can efficiently incorporate high amounts of In in the crystal, leading to InGaN compositions in the range 0-100%. THVPE InGaN growth has been demonstrated both in planar geometry and in NW geometry.

Accordingly, embodiments can employ a suitable growth technique to grow an InGaN base region. The base region may have an In content of at least 3% (e.g., 5% or more, 8% or more, 10% or more, 12% or more, e.g., up to 15%), such as in a range 5-15% (e.g., 5-10%, 10-15%, 5-12%).

The InGaN material may be characterized by its strain state. In some embodiments, a region of the InGaN material is fully relaxed, with a lattice constant (e.g., in-plane and/or vertical) equal to that of the InGaN material in its bulk state. While this disclosure focuses on InGaN, other materials providing a suitable lattice constant can be employed (e.g., AlInN, AlInGaN) according to techniques disclosed herein.

The base region may be formed on a substrate, such as sapphire or Si or GaN (including GaN template or quasi-bulk or bulk GaN). The substrate may be configured to reduce the strain of the base region (for instance, it may include several III-nitride layers with various compositions to provide strain engineering). The substrate surface may be functionalized with some other material to promote nucleation and growth. The substrate may have an offcut, including an offcut in a range 0-3° (e.g., 0-1°, 0.1-1°) in a +m direction (or −m, +a, −a, +c, −c).

The base region may be grown as a planar layer; this planar layer may then be used as-is or be etched to form lateral structures (such as mesas or NWs). In some embodiments, these lateral structures have typical lateral dimensions of 5 microns or less (e.g., 3 microns or less, 1 micron or less, 500 nm or less, 300 nm or less, 150 nm or less, such as little as 100 nm).

Figures 3A, 3B, 3C, 3D:
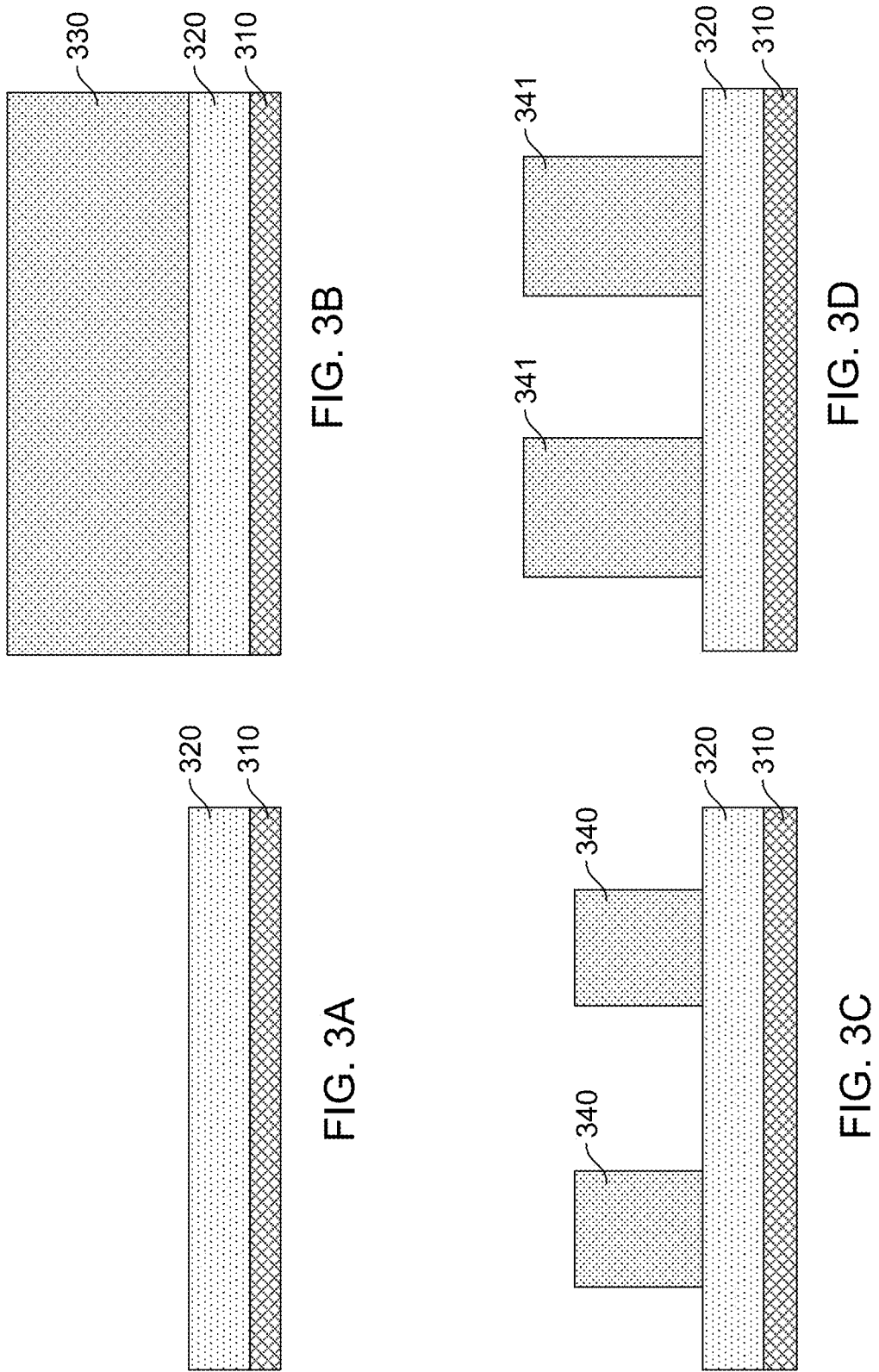
FIGS. 3A-3D show steps in an example process flow to fabricate a base region having lateral structures.

FIGS. 3A-3D shows such a process flow to fabricate a base region having lateral structures. In FIG. 3A a substrate 310 (e.g., having a buffer layer 320) is provided. In FIG. 3B a planar base layer 330 is grown (for instance by HVPE); the base layer may be InGaN. In FIG. 3C the base layer 330 is patterned and etched (e.g., by dry etch) to form lateral structures 340 (e.g., NWs). The etch may stop at the interface of the base layer (as shown in FIG. 3C), or it may leave part of the base layer un-etched, or it may extend below the base layer (e.g., in the buffer and/or substrate). The structure of FIG. 3C may be used as a base region for regrowth of the LED region. Alternatively, it may further be regrown (for instance by HVPE or another technique such as MOCVD) to grow extra material in the base region; the regrowth may occur on all surfaces of the lateral structures, or be selective. FIG. 3D shows the resulting structure, including regrown lateral structures 341, which may be used for regrowth of the LED region.

In the approach illustrated in FIGS. 3A-3C, strain relaxation may occur due to the etching of lateral structures and/or due to regrowth.

In some embodiments, the base region is grown as a structured layer, e.g., it has a non-planar shapes facilitated by lateral structures. These lateral structures may have typical lateral dimensions of 5 microns or less (e.g., 3 microns or less, 1 micron or less, 500 nm or less, 300 nm or less, 150 nm or less, such as low as 100 nm). The structuration may be obtained by forming a mask on the substrate (such as a hard mask which is patterned, and etch to clear openings giving access to the growth substrate); and growing the base region in the openings of the mask. The openings may have typical lateral dimensions of 5 microns or less (e.g., 3 microns or less, 1 micron or less, 500 nm or less, 300 nm or less, 150 nm or less, such as low as 100 nm). In some embodiments, the growth is substantially vertical above the openings, while in some embodiments the growth extends laterally outside the openings, and in some embodiments the growth progresses inward above the openings. Inward growth can be characterized by a negative growth rate in a lateral direction, and hence by a ratio of lateral-to-vertical growth which is negative. This ratio may be 0 or less (e.g., −0.1 or less, −0.3 or less, −1 or less).

FIGS. 4A-4C show such a process flow to fabricate a base region having lateral structures. In FIG. 4A a growth structure is provided, with substrate 310, buffer 320, and a growth mask 410 with openings 411 (the buffer is optional). In FIG. 4B, growth of the base layer proceeds in the openings 411, forming lateral structures 420 of e.g., InGaN. Depending on the dimensions of the mask openings 411, the lateral structures may be mesas, micro-mesas (with a typical lateral dimension of one or a few microns, e.g., 10 microns or less, 5 microns or less, 3 microns or less, 1 micron or less), or NWs. In FIG. 4C, the growth occurs not only vertically but also laterally, providing lateral structures 430 that extend beyond openings 411 over the mask 410.

The lateral growth may result in a substantial increase in the size of the lateral structures. In some embodiments, the openings in the growth mask are relatively small (as taught herein) and the lateral size of the lateral structures is relatively large. The lateral structure may have a lateral size which is at least 2 times (e.g., 5× or more, 10× or more, 20× or more, 30× or more) larger than the mask opening. The opening may have a lateral dimension selected to facilitate strain relaxation, as taught herein. The final size of the lateral structure may be selected to obtain a device of a desired size—for instance, a size sufficient to facilitate a planar-like LED fabrication process. As an example, the opening has a lateral dimension below 500 nm and the lateral structure has a lateral dimension above 1 micron.

Growth parameters may be selected to promote lateral growth. In some embodiments, a portion of the base layer grows with a ratio of lateral-over-vertical growth rate higher than 2 (e.g., 5 or more, 10 or more, 50 or more, 100 or more).

In some embodiments, the base material is first grown inside the openings with first growth parameters and, once the base material protrudes above the mask, with second growth parameters promoting lateral growth.

In some embodiments, other growth parameters are used which do not promote (or even suppress) lateral growth. For instance, once the base structure is obtained, an LED is regrown with such growth conditions. In some embodiments a layer is grown with a ratio of vertical-over-lateral growth rate higher than 2 (e.g., or 5 or more, 10 or more, 50 or more, 100 or more). For the sake of clarity, the lateral growth rate characterizes whichever non-vertical plane has the fastest growth. This could be an m-plane, an a-plane, a semipolar plane.

In some embodiments, the base region has a plurality of sub-regions. Each sub-region has lateral structures, and the properties of the structures vary between sub-regions. For instance, the dimensions of the lateral structures vary (e.g., NWs may have varying diameter or lateral dimension or height), and/or the composition of the lateral structures may vary (e.g., some NWs have 5% In, other NWs have 10% In).

The lateral structures may be mesas or NWs. They may have a height of 10 nm or more (e.g., 50 nm or more, 100 nm or more, e.g., 10 microns or less, 3 microns or less, 2 microns or less, 1 microns or less), such as in a range 50 nm-10 microns, 10 nm to 1 micron, 100 nm to 2 microns, 500 nm to 3 microns, and typical lateral dimensions of 500 nm or more (e.g., 1 micron or more, such as 20 microns or less, 10 microns or less, 5 microns or less, 3 microns or less), such as in a range from 500 nm to 20 microns, 1 to 3 microns, 1 to 5 microns, 1 to 10 microns.

A portion of the base region may be characterized by its strain state and/or by its lattice constant. In particular, the base region has regrowth surfaces, on which the LED region will be formed. These regrowth surfaces may be the top and/or the sidewall of lateral structures (NWs or mesas). The regrowth surfaces may be fully relaxed, having a lattice constant (in-plane and/or vertical) equal to that of the bulk material at the same composition. In some embodiments, the relaxation is partial, with a lattice constant that is within 1% (e.g., within 0.5%, within 0.3%, within 0.1%, within 0.05%, within 0.03%, within 0.01%) of the bulk material at the same composition. The lattice constant of a bulk relaxed material is also known as the equilibrium lattice constant. Equivalently, relaxation can be expressed in absolute units rather than relative units. A relaxed layer (including base region layer, active region layer, quantum well, superlattice) may have a lattice constant which is within 5E-3 nm (e.g., within 3E-3 nm, within 1E-3 nm, within 0.5E-3 nm, within 0.1E-3 nm) of its equilibrium lattice constant. A pseudomorphic layers grown on a first layer may have a lattice constant which is within 5E-3 nm (e.g., within 3E-3 nm, within 1E-3 nm, within 0.5E-3 nm, within 0.1E-3 nm) of the first layer's lattice constant.

The cross-section of lateral structure may have various shapes; this may influence strain relaxation. In some embodiments, the lateral structures are elongated (e.g., stripes with a length much larger than their width). This may facilitate relaxation along the narrower direction. In some embodiments, a lateral structure has a length L and a width w with L/W>3 (e.g., 5 or more, 10 or more, 50 or more, 100 or more). In some embodiments, w<300 nm (e.g., <200 nm, <150 nm, <100 nm, <75 nm, such as low as 50 nm). In some embodiments the strain is uniaxially relaxed along the direction of the width. In some embodiments, two equivalent crystal directions in the plane of a lateral structure (e.g., two so-called a- or m-directions) are characterized by a different relaxation, with the lattice constant varying by more than 0.1% between the directions. In contrast, in other embodiments, the shape is substantially regular (such as a circle, square, triangle or hexagon); this may facilitate biaxial strain relaxation. In some embodiments, two equivalent crystal directions in the plane of a lateral structure (e.g., two a- or m-directions) are characterized by an equal or similar relaxation, with the lattice constant varying by less than 0.1% between the directions.

In some embodiments, the strain of the base region varies spatially. For instance, the base region is InGaN grown on GaN. At first, the InGaN is pseudomorphic with GaN; as growth progresses, the InGaN relaxes strain (by forming defects and/or by lateral extension); after sufficient growth, the InGaN acquires a partial or full relaxation. Relaxation by lateral extension may occur as soon as the base material is free to grow laterally, for instance when growth reaches the top of a patterned mask. In the case of relaxation by defect formation, extended defects may terminate at the sidewalls of the lateral structure (for instance they may bend towards sidewalls) rather than propagating in the growth direction.

Some embodiments are characterized by the small thickness required to achieve relaxation: relaxation may occur within less than 1 micron of growth (e.g., 500 nm or less, 200 nm or less, such as little at 100 nm). This may be facilitated by the presence of lateral structures, which offer mechanisms for relaxation beyond those available in quasi-bulk layers. In some embodiments, a base region contains an InGaN composition characterized by a bulk critical thickness t for relaxation, and relaxation occurs within a thickness less than 80% (e.g., 50% or less, 20% or less, 10% or less, such as little as 1%) of t.

In some embodiments, the relaxation remains elastic, and plastic relaxation is avoided. In some embodiments, plastic relaxation occurs and is associated with the formation of extended defects (such as dislocations); the structure is configured such that these extended defects remain far away (e.g., at least 100 nm) from the light-emitting layers (this can be achieved by growing sufficiently thick material over the zone of plastic relaxation).

In some embodiments, the regrowth surfaces have a low defect density. It may have a threading dislocation density (TDD) less than 5E8 cm$^{-2}$ (e.g., 1E8 cm$^{-2}$ or less, 5E7 cm$^{-2}$ or less, 1E8 cm$^{-2}$ or less, 5E6 cm$^{-2}$ or less, as low as 1E6 cm$^{-2}$). This low TDD may be achieved by growing the base region on a low-TDD substrate. It may be achieved by having TDDs migrate to lateral regions, or to annihilate with each other upon sufficient growth. The density of defects (including TDDs, stacking faults, v-pits) may be configured to be less than one per lateral structure (e.g., one per NW, one per ten lateral structures or less, one per hundred lateral structures or less).

In some embodiments, the base region includes NWs having a non-homogeneous composition. For instance, the base region NWs may comprise InGaN at a first composition (e.g., 5%) and InGaN at a second composition (e.g., 8%).

Figures 5A, 5B, 5C, 5D:
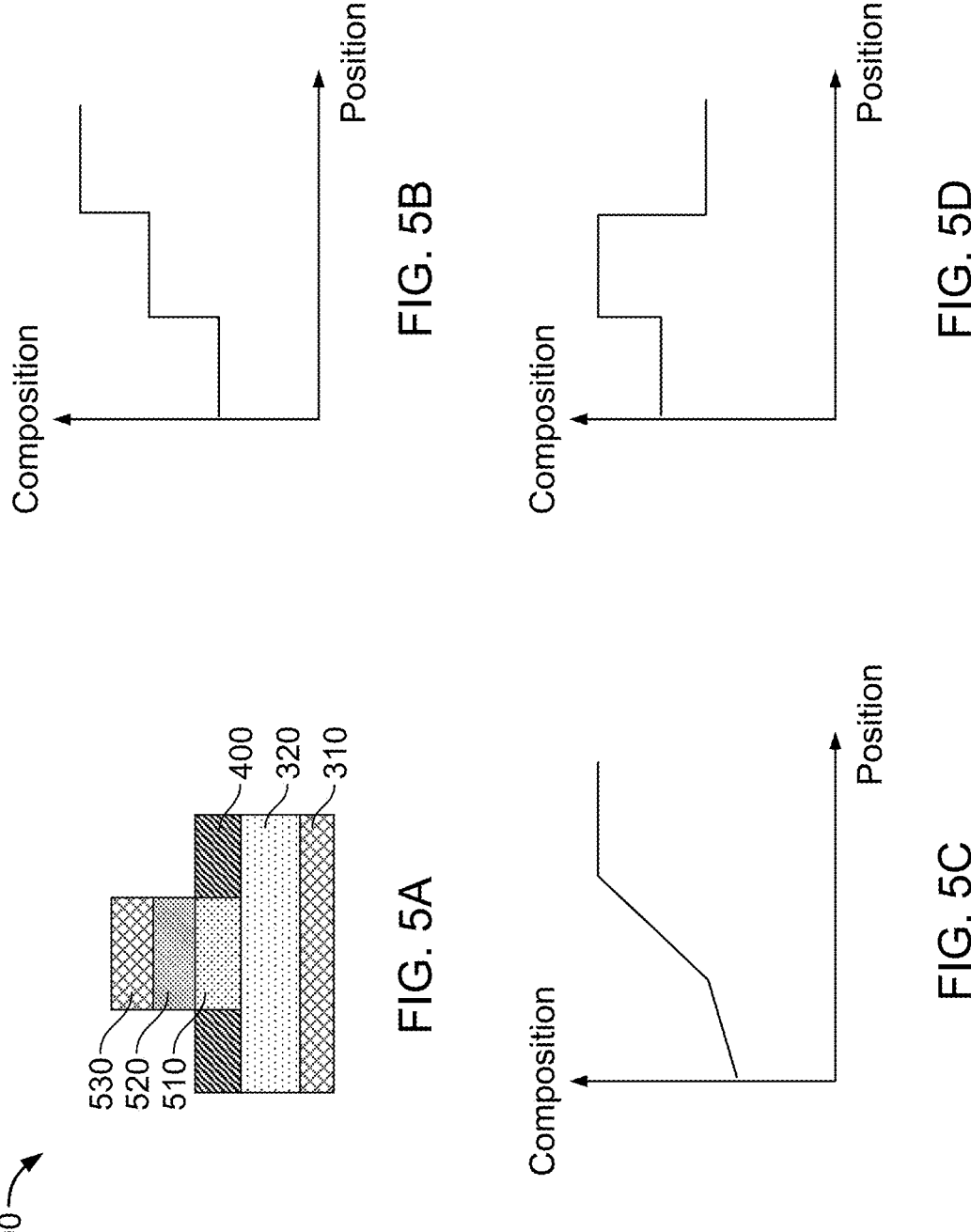
FIG. 5A is a cross-sectional view of an example LED emitter structure.
FIGS. 5B-5D shown example composition profiles for the LED emitter structure shown in FIG. 5A.

FIGS. 5A-5D shows a base region having varying In content. In FIG. 5A the base region has NWs 500. The NWs 500 have a plurality of regions 510, 520, and 530 with different compositions (e.g., 1, 2, 3). The regions 510, 520, and 530 may be planar or have another shape. In the example of FIG. 5A the first composition coincides with the mask 410 thickness, though this need not be the case. The strain and strain relaxation may vary between regions. As shown in FIG. 5B, the In composition may increase during the growth (for instance 3% then 5% then 10%); this may facilitate gradual strain relaxation. Hence the variation in In % along the main epitaxial direction may be at least 2%. The regions may be discrete, or the composition may vary continuously as in FIG. 5C. As shown in FIG. 5D, a high-In region may be followed by a lower-In region (e.g., 5% on 8%); in this case, the high-In region may be partially relaxed and defective, and the lower-In region may have higher relaxation and lower defects (for instance, because it grows pseudomorphically or with low/no strain on the high-In region).

In some embodiments, the regrowth surface has a homogeneous composition, with a composition of each element varying by 2% or less (e.g., 1% or less, 0.5% or less) across the regrowth surface.

In some embodiments, the base region or a portion thereof is doped (e.g., n-doped or p-doped). For instance, the base region has an n-doped InGaN region due to the presence of one or more dopants (such as O, Si) or a p-doped InGaN region due to the presence of a dopant (such as Mg, Ge). The doping level may be sufficient to provide good carrier conductivity: it may be at least 1E16 (e.g., 5E16 or more, 1E17 or more, 5E17 or more, 1E18 or more, 5E18 or more, 1E19 or more, 5E19 or more). The doping level may be low enough to avoid free-carrier absorption: it may be less than 1E20 (e.g., 5E19 or less, 1E19 or less, 5E18 or less, 1E18 or less). Suitable lower and upper doping bounds may depend on the doping species (due to variations in activation level and optical cross-section among species). In some embodiments, the doping species is O and the doping level is in a range $1E17$-$1E19$ cm$^{-3}$. The doping species may form a variety of states in the crystal, including complexes and interstitials. Embodiments where the base region is p-doped open the possibility for reverse-polarity structures (i.e., junctions with n over p in the LED stack). In such cases, the LED growth may begin with undoped InGaN, growth of undoped layers including the active region, and finally growth of n-GaN. If needed, the base region may be activated before regrowth. Reverse-polarity structures may be inverted during processing to expose the p-layers of the base region; a p-regrowth step may be performed on these exposed p-layers to create a contact layer for forming a p-contact.

The base region may be grown in an HVPE reactor. The reactor may use various precursors, including mono-halides (e.g., GaCl, InCl) and/or tri-halides (e.g., GaCl$_3$, InCl$_3$). MCl and MCl$_3$ (where M is a group-III metal including Ga, In, Al) may be obtained by pre-reacting M with HCl or a gaseous Cl species (including Cl$_2$), or from a solid form (e.g., sublimation of a MCl or MCl$_3$ solid/powder in a suitable carrier gas such as N$_2$ or H$_2$). The precursors may be formed in the reactor, e.g., in a separate region from the growth region. The reactor may use NH$_3$ as a source for N. In some embodiments, InCl$_3$ facilitates the incorporation of a high indium composition in the base region, e.g., more than 3% (e.g., 5% or more, 8% or more, 10% or more). Carrier gases, including H$_2$/N$_2$/Ar/He and combinations thereof, may be mixed with these precursors gases. The growth may employ one of the following precursor combinations: GaCl/InCl, GaCl/InCl$_3$, GaCl$_3$/InCl, GaCl$_3$/InCl$_3$. Some precursor combinations may be suited for some growth directions. In some embodiments, the precursors are GaCl$_3$/InCl$_3$ and the growth occurs along the −c plane. In some embodiments, the precursors are GaCl/InCl$_3$ and the growth occurs along the +c plane. The InCl$_3$ precursor may facilitate the incorporation of high-In; in some embodiments, InCl$_3$ is used and the base region has an In(x)Ga(1-x)N material with x>0.05. More generally, possible precursors include MX and MX$_3$ where M is a group-III metal (In, Ga, Al) and X is one of Cl, Br, I.

The composition of the base region may be selected to provide sufficiently-small lattice constant mismatch with the LED region's light-emitting layers. In some cases, this requires InGaN material with a composition within the miscibility gap. Embodiments of the invention facilitate this by using growth techniques (e.g., HVPE) and growth parameters that favor kinetic growth such that the miscibility gap disappears. The pressure (or partial pressure of a species) may be maintained at a predetermined value to ensure kinetic growth. A predetermined supersaturation of a species may be obtained.

Doping elements may further be introduced in the HVPE reactor. A source of dopant may be gaseous, including an O-containing gas (including O$_2$) or a Si-containing gas (including silane, dichlorosilane); it may be solid (e.g., an oxide or solid-form Si, including high-purity crystalline Si). The doping species and concentration may be selected to limit the doping-induced strain.

In some embodiments, the base region growth conditions are selected to reduce defect formation. In particular, low density of vacancies (including N or Ga or In) may be sought, with a density of a vacancy less than 1E18 cm$^{-3}$ (e.g., 1E17 cm$^{-3}$ or less, 1E16 cm$^{-3}$ or less, 1E15 cm$^{-3}$ or less, 1E14 cm$^{-3}$ or less, 1E13 cm$^{-3}$ or less, 1E12 cm$^{-3}$ or less, 1E11 cm$^{-3}$ or less, such as 1E10 cm$^{-3}$). The low density may be achieved by employing a relatively low growth temperature, such as 900° C. or less (e.g., 850° C. or less, 800° C. or less, 750° C. or less, 700° C. or less, 650° C. or less, 600° C. or less, 550° C. or less, 500° C. or less). The low density may be achieved by employing high partial pressure of the corresponding species.

The composition of the base region may be controlled to limit optical absorption of the light emitted by the LED region. In some embodiments, the LED region has sub-regions emitting at various wavelengths (e.g., blue/green/red); hence, reabsorption of the shortest wavelength is the likeliest. The composition of the base region is selected to limit optical absorption of the shortest wavelength. In some embodiments, a sub-region of the LED region emits short-wavelength light (e.g., blue light) with a peak wavelength; and the bulk absorption coefficient of the base layer at the peak wavelength (i.e., the absorption it would have in bulk form) is less than 10 cm$^{-1}$ (e.g., 5 cm$^{-1}$ or less, 2 cm$^{-1}$ or less, 1 cm$^{-1}$ or less). In some embodiments, after a full device is formed, the net power absorption of short-wavelength light by the base region is less than 10% (e.g., 5% or less, 2% or less, 1% or less). This net power absorption quantifies how much of the total light is absorbed by the base layer, and competes directly with the devices' net extraction efficiency. In other words, the extraction efficiency (for a subpixel of given color) can be written Cex=1−Abase−Aother, with Abase the net base layer absorption and Aother the absorption from all other sources (metal, active region, free carrier absorption . . . ). In some embodiments, Abase<10% (e.g., <5%, <2%, <1%) for blue subpixels.

Absorption may be reduced by selecting the composition and thickness of absorbing materials, as taught above. Other means can be used to limit absorption, alone or together with material composition. This includes forming LED devices wherein light trajectories between subpixels (e.g., from a blue LED to a red LED) are reduced or blocked, for instance by forming an optical-isolation layer (e.g., a reflector, a mirror) between subpixels. This includes selecting an appropriate physical layout for subpixels. This includes removing an absorbing material (e.g., by etching, grinding, and other techniques disclosed herein). In some embodiments, an absorbing material (e.g., a substrate, an epitaxial layer, a portion of a base material) is present during some epitaxial steps and is removed or partially removed (e.g., at least 25%, at least 50%, at least 90% of the material is removed) while devices are processed.

Accordingly, the In composition of the base region may be high enough to reduce the strain in the active region but low enough to reduce optical absorption. In some embodiments, the In composition of the base region is in a range of 2%-20% (e.g., 5-10%, 2-5%, 3-10%, 5-8%, 5-12%, 5-15%, 10-20%).

In some embodiments, the regrowth region is prepared for regrowth. A surface treatment may be performed to ensure the regrowth region is epi-ready. The surface treatment may include one or several wet etches (including acid, base, solvent). Some wet etches may selectively etch some crystal planes. Wet etches may comprise KOH or $H_3PO_4$ etch. In some embodiments, a polishing step is performed to obtain a smooth surface, with an RMS roughness less than 5 nm (e.g., 3 nm or less, 1 nm or less, 5 A or less, 3 A or less). The polishing may be mechanical, chemical, chemico-mechanical, grinding, and other techniques known in the art. In some embodiments, a dry etch step (such as ICP, RIE) is employed to etch material. Several techniques may be combined to achieve a desired thickness and a desired surface state. In some embodiments a first step (e.g., dry etch) removes material, and a second step (e.g., polishing or wet etch) facilitates a low roughness. In some embodiments, the regrowth region has a surface with a desired offcut from a crystal direction. For instance, the regrowth surface may be slightly off from a c-plane, with an offcut angle in a range 0.1-5° (e.g., 0.1-1° or 1-5°) in a specific direction (including the a-plane or m-plane). The offcut may be obtained by a polishing step.

Figures 6A, 6B:
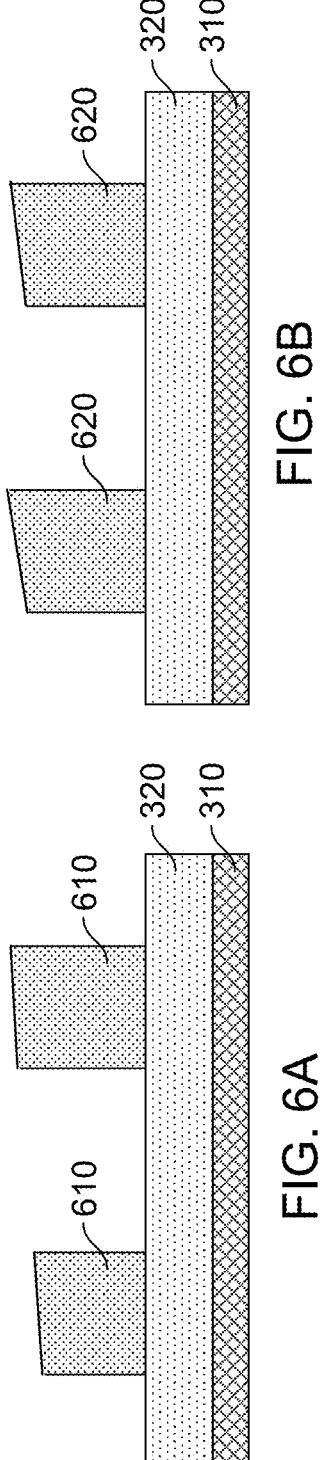
FIG. 6A and FIG. 6B are cross-sectional diagrams showing example LED emitters with an offcut.
Figures 8A, 8B, 8C, 8D, 8E, 8F, 8G, 8H, 8I:
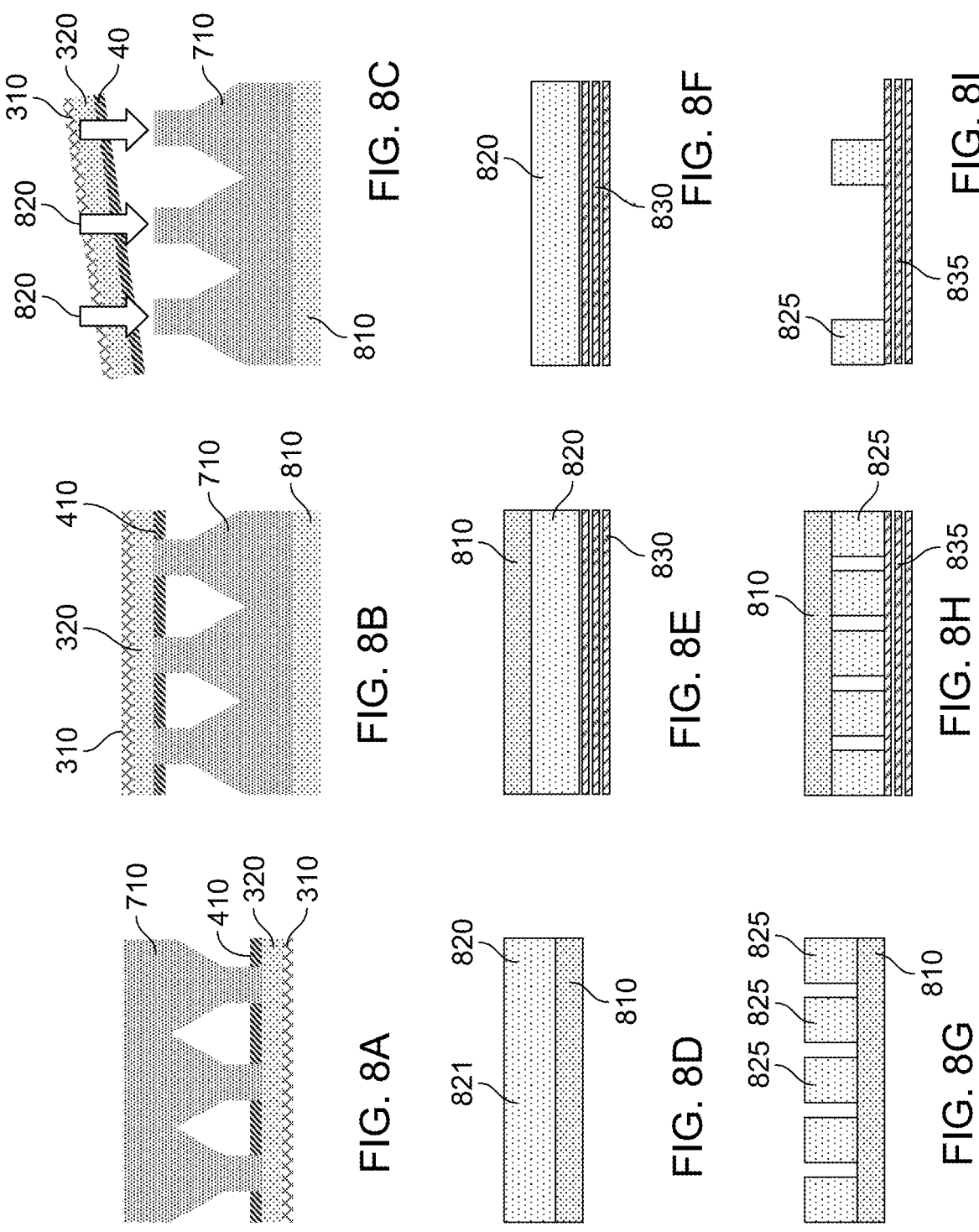
FIGS. 8A-8I show steps in an example process flow for fabricating an LED emitter.

FIGS. 6A-6B shows examples of base regions having NWs with offcut. In FIG. 6A, the top surface of the base region is slanted across a macroscopic distance (e.g., the whole wafer) providing NWs 610 sharing an offcut. In FIG. 6B the offcut occurs individually for each NW 620.

The growth reactor may be operating at a pressure selected for high material quality and desired material properties. A high pressure may be desirable to reduce the presence of some defects, including vacancies. In some embodiments the pressure is atmospheric pressure, or is higher than 1 atm (such as at least 1.2 atm, at least 1.5 atm, at least 2 atm, at least 5 atm, at least 10 atm). In some embodiments, the partial pressure of the N-containing species is high to reduce the presence of N-vacancies in the crystal. In some embodiments, the pressure is selected to promote strain relaxation as disclosed herein.

Growth parameters may be selected to ensure a sufficient growth rate. In some embodiments, the growth rate is at least 1 micron/hr (e.g., 5 microns/hr), which may be sufficient to grow a base region with a thickness in a range 100 nm-10 microns. In some embodiments, the growth rate is at least 20 microns/hr (e.g., 50 microns/hr, 100 microns/hr), which facilitates the growth of thick base layers and/or quasi-bulk base layers.

The HVPE reactor may adopt a variety of geometries, including geometries more often encountered in other growth techniques which may provide advantages for embodiments. It may have a longitudinal/horizontal shape. It may have a vertical flow. The reactor may be a dual-flow reactor, with a carrier gas flow in a given direction and a secondary gas flow in a second direction that facilitates control of the carrier gas flow. It may have a showerhead design. The geometry may be selected to improve growth uniformity. The growth may occur over at least one wafer with a radius of at least 4", and the In composition of the base layer material may vary by less than 3% (e.g., 2% or less, 1% or less, 0.5% or less) across an area which is at least 60% (e.g., 80% or more, 90% or more) of the wafer area. The reactor may include quartz material. It may be a cold-wall reactor. It may be a hot-wall reactor, with the temperature of the inner walls of the reactors maintained above a desired temperature, including at least 400° C. (e.g., 500° C. or more, 600° C. or more, 650° C. or more, 700° C. or more). The reactor may be designed to limit the presence of specific atomic species in the crystal. This includes species including Fe, Cu, Sn, C, B, Mn. The concentration of a selected species may be below $1E15$ $cm^{-3}$ (e.g., $1E14$ $cm^{-3}$ or less, $1E13$ $cm^{-3}$ or less, $1E12$ $cm^{-3}$ or less, $1E11$ $cm^{-3}$ or less, $1E10$ $cm^{-3}$ or less). In some embodiments, the part of the reactor where growth occur is set at a higher temperature than other parts of the reactor, to reduce defect incorporation and/or parasitic nucleation. The temperature difference may be at least 50° C. (e.g., 100° C. or more, 150° C. or more). In some embodiments, the wafer temperature may be kept below a maximum temperature to limit the formation of some defects with high formation energy (e.g., N-vacancies and/or group III-vacancies) in the base material. Accordingly, the wafer temperature may be in a range 400-1000° C. (e.g., 500-600° C., 400-800° C., 450-750° C., 550-650° C.).

In some embodiments, the base region is initially grown with lateral structures, and is coalesced to form a continuous layer. FIG. 7A shows such a geometry in which lateral structures 710 coalesce, providing a continuous surface 711. Growth conditions may be selected to promote lateral growth (including promotion of growth along a plane, such as a semi-polar or non-polar plane); in some cases, the growth occurs along six equivalent crystal planes of a wurtzite structure. The material from separate lateral structures may coalesce at growth fronts. The coalescence fronts may be planes, points (i.e., apexes) or other regions. In some cases, defects such as dislocations, stacking faults and other crystal registration faults may be formed at the coalescence fronts. Alternatively, the coalescence fronts may be defect-free. The geometry of the lateral structure and growth conditions may be controlled to reduce coalescence defects. The base region may be grown on a patterned mask, whose geometry is selected to match the lateral growth behavior and reduce defects. For instance, the mask has a triangular lattice and the growth fronts propagate along six equivalent directions of a wurtzite structure. As shown in FIGS. 7B and 7C, the mask openings 720 may be aligned such that the growth fronts 730 are parallel or perpendicular to the mask's triangular lattice, resulting in planar (FIG. 7C) or point-like (FIG. 7B) coalescence fronts. This may correspond to alignment of the mask lattice with m-planes or a-planes, respectively. The alignment may also intentionally be tilted from an a- or m-plane by a preselected angle, such as 1 deg or 2 deg or 5 deg or 10 deg. In some embodiments, the mask is aligned with the crystal's lattice to within +/−5 deg (e.g., +/−1 deg, +/−0.1 deg). In some embodiments, no more than one dislocation (or dislocation bundle) is created on average at a point-like coalescence growth front. This is illustrated in FIG. 7D, which shows mask openings 720 relative to dislocations 750. The base region's continuous layer surface may be planar after growth, or it may be planarized by a process.

Coalescence may be obtained solely with one growth technique (e.g., HVPE, MOCVD), or by successive growth steps with different techniques. In some embodiments, a base layer with lateral structures is grown by HVPE; an MOCVD regrowth is used to coalesce the lateral structures. The LED region is then grown, either in the same MOCVD reactor as the coalescence step, or in a third growth step (i.e., separate MOCVD growth for the coalescence and LED regions).

The base region may be processed before the LED region is grown. The base region may be transferred to a submount before the LED region is grown. In some cases, the base region has a planar top surface. The top surface may have group-III polarity (i.e., along the +c direction). It is transferred once, with the top surface attached to the submount. The growth substrate and buffer (if any) may be removed by techniques disclosed herein, including grind and polish and/or laser lift off. A portion of the exposed base region may be removed/thinned down; this may include the non-coalesced portion (i.e. the portion with the lateral structures). This can be achieved by techniques disclosed herein, including grind and polish. The base region after this step may be planar. The base region may be transferred a second time to a second submount. After this, the base region may be a planar layer continuously attached to the second submount, with the top surface exposed again. This transferred base region may be employed as a growth substrate/template for the LED growth. The transferred base region may further be patterned (e.g., with mesa shapes): mesas with small dimensions may be formed, such as micron-scale mesas suitable as sub-pixels. Such mesas may be formed at various parts of the process, for instance once the base region is thinned on the first submount, or after the base region is transferred to a second submount.

FIGS. 8A-8I illustrate such a process flow. (A) coalesced base region 710, grown, for instance, on substrate 310 with buffer 320 and mask 410, is provided. (B) the base region is attached to a submount 810. (C) the substrate/mask/buffer is removed by laser-lift-off 820. (D) the base region is thinned to obtain a thinned base region 820 a planar surface 821. (E) The base region is attached to a second submount 830. (F) the first submount 810 is removed. Alternatively, after step (D), in (G) the base region is patterned into mesas 825. (H) the base region with mesas 825 is contacted with a second submount 835. (I) Some of the mesas 825 are transferred. This selective transfer may be achieved by various techniques (e.g., by having a patterned material on the second submount which facilitates the selective binding of some mesas; or by a mechanical force applied to selective mesas, such as a force applied through the first and/or second substrates to push some mesas).

The base region transfer methods disclosed herein may be used to combine various base regions on a same submount. For instance, several coalesced base regions are combined; they have differing compositions and/or strain states. This can be achieved by repeating the process of FIG. 8I. The base regions may be combined spatially on the submount such that each base region corresponds to a type of subpixel. For instance, three base regions having mesas with increasing In compositions form three sets of subpixels on a submount, and are used to regrow LED regions. A repair process may be used to replace defective mesas before or after regrowth.

LED Region Growth

The LED region is grown on a regrowth surface of the base region.

The LED region may have InGaN layers (doped and/or undoped) for carrier transport, akin to the usual GaN n-layers, p-layers, and lower and upper barriers found in conventional III-nitride LEDs. It may have AlGaN or AlInGaN or AlInN layers which serve the role of an electron blocking layer. It may have an active region with light-emitting quantum wells (QWs)/barriers made of InGaN/GaN or InGaN/InGaN. It may have a defect-reduction layer (such as a homogeneous InGaN or AlInN layer, or a superlattice of InGaN/InGaN, InGaN/GaN, InGaN/AlInN and other variations of III-nitride layers). These various layers may have a composition selected to reduce the strain of the light-emitting layers.

In some embodiments, the regrowth surface is a top surface of the NWs, as in FIG. 1A. In some embodiments, the regrowth surface comprises several surfaces of the NWs, e.g., the top surface and sidewalls as in FIG. 1B.

In some embodiments, the LED region is pseudomorphic with the regrowth surface, or it is close to pseudomorphic (with every layer in the LED region having an in-plane lattice constant which differs from that of the regrowth surface by less than 0.1% or 0.01%). Therefore, the lattice constant of the regrowth surface is important, as it determines the strain state of the active region.

In some embodiments, the active region includes one or several QWs having a composition. The composition may comprise at least 10% (e.g., 15% or more, 20% or more, 25% or more, 30% or more, 35% or more, 40% or more) In.

The base region and layers of the LED region may be configured to reduce the strain of the QWs. For instance, the base region has a base composition (e.g., In0.1GaN), and some n-layers and p-layers of the LED region have the same base composition, so that they are strain-free. The barriers between QWs may also have the same base composition or a similar composition. The composition of barriers may be configured to compensate for the stress of the QWs. For instance, the barriers have less In than the base region, and they are in tensile strain which compensates the compressive strain of the QWs.

An example of compositions in the stack is as follows (with all layers but the first being regrown as part of the LED region):

| Name | Composition | Thickness | Strain state |
| --- | --- | --- | --- |
| Base | In0.1GaN | 1 um | Relaxed |
| n-layer | In0.1GaN | 100 nm | Relaxed |
| Defect-reduction layer (n-doped) | In0.1GaN/ In0.15GaN superlattice | 100 nm | Relaxed/ compressive |
| Spacer (n-doped and/or undoped) | In0.1GaN | 10 nm | Relaxed |
| QW | In0.3GaN | 2.5 nm | Compressive |
| Barrier | In0.05GaN | 5 nm | Tensile |
| QW | In0.3GaN | 2.5 nm | Compressive |
| Barrier | In0.05GaN | 5 nm | Tensile |
| QW | In0.3GaN | 2.5 nm | Compressive |
| Spacer (p-doped and/or undoped) | In0.1GaN | 10 nm | Relaxed |
| Electron blocking layer (p-doped or undoped) | GaN | 20 nm | Tensile |
| p-layer | In0.1GaN | 100 nm | Relaxed |
| p++ layer | In0.1GaN | 20 nm | Relaxed |

The strain state can be quantified by various quantities. A convenient quantity is the misfit strain (or basal strain field) between the in-plane lattice parameters of two layers:

$$e=(a\_b-a\_l)/a\_l,$$

where a_b is the equilibrium in-plane lattice constant of the base layer (i.e. the layer on which pseudomorphic growth occurs) and a_l is the in-plane equilibrium growth occurs) lattice constant of the layer being grown.

In some embodiments, the misfit strain in the QWs is reduced to less than 80% (e.g., 50% or less, 30% or less, 20% or less, 10% or less) of the misfit strain if the QWs were grown pseudomorphically on a relaxed GaN surface. For instance, c-plane In20GaN QWs grown pseudomorphically on c-plane GaN would have a misfit strain value of −2.2%. In some embodiments, the same In20GaN QW is grown pseudomorphically on a relaxed In10GaN layer, and its misfit strain is about −1.1%, which is about half the strain for growth on GaN.

The table below shows possible embodiments. Embodiments may be configured according to minimum and maximum bounds taught in this table. For instance, an embodiment may have a base layer with an in-plane lattice constant having a value above a selected value (e.g., 3.22 A) and an active region having at least an InGaN composition above a selected value (e.g., 30%), and be configured to have a misfit strain ratio below a selected value (e.g., 67%).

| Base layer In % | Base layer in-plane lattice constant | Active layer In % | Active layer in-plane lattice constant | Misfit strain | Misfit strain ratio |
|---|---|---|---|---|---|
| 5% | 0.32068 | 20% | 0.32602 | −1.6% | 75% |
| 5% | 0.32068 | 30% | 0.32958 | −2.7% | 83% |
| 5% | 0.32068 | 40% | 0.33314 | −3.7% | 88% |
| 5% | 0.32068 | 50% | 0.3367 | −4.8% | 90% |
| 10% | 0.32246 | 20% | 0.32602 | −1.1% | 50% |
| 10% | 0.32246 | 30% | 0.32958 | −2.2% | 67% |
| 10% | 0.32246 | 40% | 0.33314 | −3.2% | 75% |
| 10% | 0.32246 | 50% | 0.3367 | −4.2% | 80% |
| 15% | 0.32424 | 20% | 0.32602 | −0.5% | 25% |
| 15% | 0.32424 | 30% | 0.32958 | −1.6% | 50% |
| 15% | 0.32424 | 40% | 0.33314 | −2.7% | 63% |
| 15% | 0.32424 | 50% | 0.3367 | −3.7% | 70% |
| 20% | 0.32602 | 30% | 0.32958 | −1.1% | 33% |
| 20% | 0.32602 | 40% | 0.33314 | −2.1% | 50% |
| 20% | 0.32602 | 50% | 0.3367 | −3.2% | 60% |
| 20% | 0.32602 | 60% | 0.34026 | −4.2% | 67% |
| 25% | 0.3278 | 30% | 0.32958 | −0.5% | 17% |
| 25% | 0.3278 | 40% | 0.33314 | −1.6% | 37% |
| 25% | 0.3278 | 50% | 0.3367 | −2.6% | 50% |
| 25% | 0.3278 | 60% | 0.34026 | −3.7% | 58% |

This table assumes that the base layer is relaxed InGaN. However, other materials with a similar in-plane lattice constant (including In-containing III-nitride compounds and other materials) are also suitable. The misfit strain ratio is the ratio of the actual misfit strain (between the base layer and active layer) to the value of the misfit strain if the active layer were grown pseudomorphically on GaN.

In some embodiments, the strain component epsilon_3 is approximately proportional to the misfit strain, and the strain-induced polarization field is therefore approximately proportional to the misfit strain. Accordingly, the misfit strain ratio values enabled herein may also correspond to values of the polarization field ratio, which is defined as the actual polarization field in an active layer divided by the polarization field if the structure were pseudomorphically to GaN.

In some embodiments, at least 50% (e.g., 80% or more, 90% or more) of the light emitted by an LED is emitter by one or several active layers, and the active layers are further characterized by properties taught herein (such as composition, misfit strain, misfit strain ratio, polarization field ratio)

In some embodiments, the active region has a composition, and a thickness which is at least 1.5× (e.g., 2× or more, 3× or more) the critical thickness for pseudomorphic growth on relaxed GaN at that composition. This is facilitated by the strain reduction in the active region. In some embodiments, a QW has a thickness in a range 2-4 nm and a composition in a range 30-60%.

In some embodiments, the active region has a light-emitting layer with In content of at least 30% (e.g., 35% or more, 40% or more, 50% or more, e.g., in a range 30-60%), and a thickness of at least 2 nm (e.g., 2.5 nm or more, e.g., in a range 2-5 nm).

In some embodiments, the active region undergoes lateral relaxation upon its growth. For instance, the active region is planar (perpendicular to the axis of the base NWs/platelet/mesa), as in FIG. 1A. Upon growth, the active region is compressively strained, because it has a high In composition and hence a larger in-plane lattice constant than the underlying layers (including the base region). The typical lateral dimensions of the NW are small enough that the strain is relaxed by lateral expansion of the active region. The relaxation may be partial. The active region may include a quantum well with an in-plane lattice constant, which is larger than that of the base region's regrowth surface, by at least 0.01% (e.g., 0.03% or more, 0.05% or more, 0.1% or more).

The prior art has demonstrated structures with InGaN relaxation (e.g., plastic relaxation by forming defects in very thick InGaN layers). However, such structures are believed to have very poor IQE. In contrast, some embodiments of the invention maintain a low defectivity and/or a high IQE while reducing active region strain. This is facilitated by growth on the relaxed base region.

Accordingly, some embodiments are characterized by a low defect level in the active region. The active region may have a TDD less than $5E8 \text{ cm}^{-2}$ (e.g., $1E8 \text{ cm}^{-2}$ or less, $5E7 \text{ cm}^{-2}$ or less, $1E8 \text{ cm}^{-2}$ or less, $5E6 \text{ cm}^{-2}$ or less, $1E6 \text{ cm}^{-2}$ or less). It may have a density of stacking faults or misfit dislocations less than $1E5 \text{ cm}^{-1}$ (e.g., $1E4 \text{ cm}^{-1}$ or less, $1E3 \text{ cm}^{-1}$ or less, $1E2 \text{ cm}^{-1}$ or less, $1E1 \text{ cm}^{-1}$ or less). In embodiments having lateral structures (e.g., NWs or micro-mesas), the density of defects (including TDDs, stacking faults, v-pits) may be configured to be less than one per lateral structure (e.g., one per NW) or one per ten lateral structures or less than one per hundred lateral structures.

Some embodiments are characterized by a high internal quantum efficiency (IQE). The high IQE may be substantially higher than what could be obtained by conventional strained growth on GaN. This may be facilitated by the reduced strain in the active region.

Figure 9:
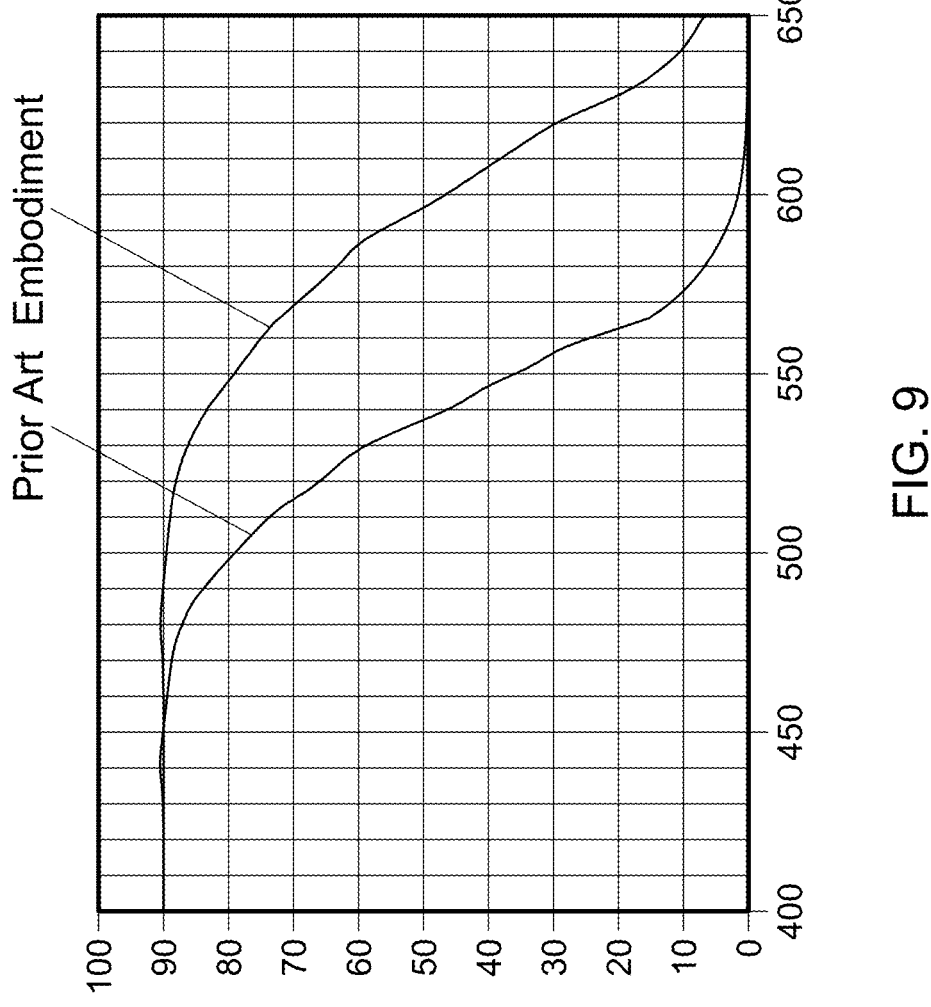
FIG. 9 is a plot showing example relationships between wavelength and internal quantum efficiency for an example embodiment and prior art.
Figures 10A, 10B, 10C:
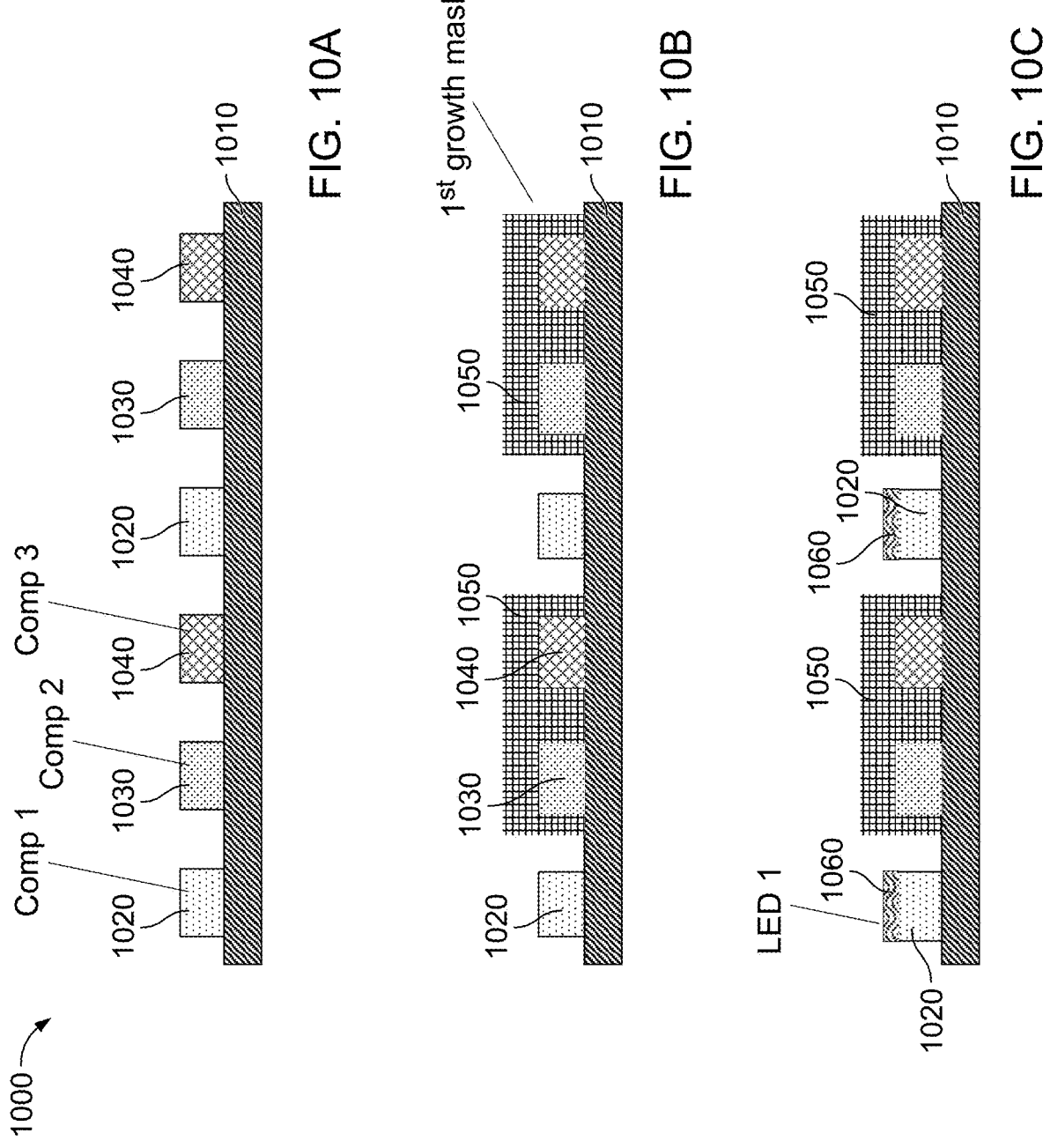
FIG. 10A-10E are cross-sectional diagrams showing an example process with LED region regrowths.
Figure 10D:
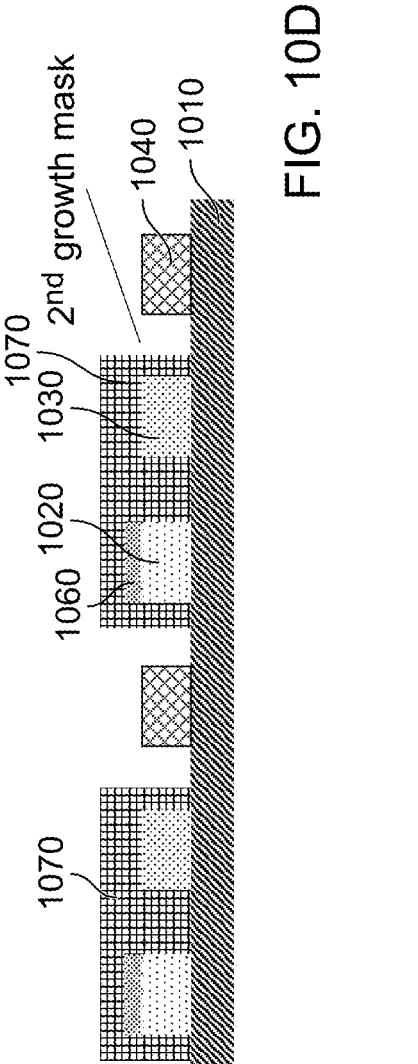
Figure 10E:
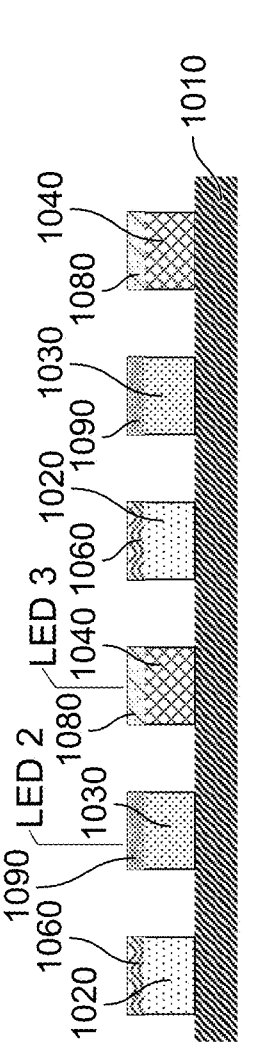

FIG. 9 shows the relationship between wavelength and IQE, and contrasts the prior art with embodiments. The prior art curve is based on public data for planar LEDs grown by MOCVD with various emission wavelengths: the IQE is strongly reduced at long wavelength, a manifestation of the well-known green gap. It is believed that strain contributes (at least in part) to this reduction. Accordingly, the impact of strain on IQE can be modeled, and the improvement in IQE upon strain reduction can be predicted. The embodiment curve shows the result of this procedure, and shows the anticipated performance of some embodiments. Here, a fully-relaxed base layer with In0.05GaN is considered. The best prior art devices reported in the red range (620-630 nm) have an EQE of about 2-2.5%, corresponding to an IQE of about 3%. In contrast, some embodiments have an IQE of at least 5% (e.g., 10% or more, 15% or more, 20% or more, 30% or more) at a peak emission wavelength of at least 610 nm (e.g., 620 nm or more, 625 nm or more, 630 nm or more). FIG. 9 is an illustration, and other values of In composition and strain relaxation may be required to achieve a desired IQE. Embodiments include methods of selecting a desired peak emission wavelength and at least one criterion for a figure of merit of an optoelectronic device (including a minimum desired value of IQE or external quantum efficiency (EQE) or wall plug efficiency (WPE)), and configuring an emitter as taught herein (including selecting a composition and a strain state for a base region) to achieve the at least one criterion. In one embodiment, the emission wavelength is at least 615 nm, the IQE is at least 15%, and the base region has an In composition of at least 5% and is substantially fully relaxed.

In some embodiments, the base region has a plurality of sub-regions. The sub-regions have base layers with different In compositions. This can be achieved as disclosed herein (for instance following the process of FIGS. 8A-8I). For instance, there are sub-regions with GaN NWs, In0.05GaN NWs and In0.1GaN NWs. The regions with more In are more amenable to growing long-wavelength LEDs. Due to the lattice pulling effect, the regions with more In may naturally incorporate more In during the LED growth, for the same growth conditions. In some embodiments, growth of the LED region occurs simultaneously on the various sub-regions; due to lattice pulling, the various sub-regions have different active region compositions and different emission wavelengths. In some embodiments, three sets of sub-regions are present and LEDs are grown simultaneously on these which respectively emit blue, green and red light. The base region may have three sets of sub-regions with different compositions. LED regions emitting blue, green and red light are respectively regrown on the three sets of sub-regions.

In some embodiments, the sub-regions have NWs with varying diameter. For instance, there are sub-regions with diameters of 80 nm, 120 nm and 150 nm. This facilitates variations in In incorporation during the LED region growth. For instance, the regions with smaller diameter facilitate a higher In incorporation, because the In atoms are consumed by a smaller growth volume. In some embodiments, three sets of sub-regions are present and LEDs are grown simultaneously on these, which respectively emit blue, green and red light.

The two concepts presented above may be combined. The sub-regions may have varied composition and varied NW size, and the size and composition pulling effects may be combined to achieve various emission wavelengths (including the simultaneous growth of LED with desired wavelengths, such as blue/green/red).

In some embodiments, re-growth of the LED regions over the several sub-regions is performed with the same regrowth step. In other embodiments, several regrowth steps are performed. For instance, the base region has 3 sets of sub-regions. A first set is exposed, while the two other sets are covered by a growth mask. The mask may include an oxide material (including SiOx, AlOx); a nitride material (SiNx, AlNx); a dielectric layer; a metal (including Mo). A growth step is performed (e.g., by MOCVD) and LED regions with a first wavelength are formed over the first set of subregions—these may form e.g., blue subpixels. The process is repeated with the other two sets of sub-regions to form other LED regions emitting at other wavelengths (e.g., green and red).

FIG. 10A-10E illustrates a process with LED regions regrowths. (A) a member 1000 is provided with three sets of base sub-regions 1020, 1030, and 1040, on a substrate 1010. The sets have InGaN compositions 1, 2 and 3. (b) a 1$^{st}$ growth mask 1050 is formed over sub-regions 1030 and 1040. (C) Growth of LED sub-regions 1060 is performed over base sub-regions 1020. (D) the 1$^{st}$ growth mask 1050 is removed and a 2$^{nd}$ growth mask 1070 is formed over sub-regions 1020 and 1030. (E) After repeating masking and epi steps several times, LED sub-regions 1060, 1080, and 1090 are grown on all base sub-regions 1020, 1030, and 1040.

In some embodiments, successive regrowth steps are performed for different wavelengths, and the longer-wavelength steps are performed last. For instance, the red LEDs are grown last. This may facilitate good material quality, because long-wavelength active regions require high In contents which can have a low thermal budget. In some embodiments, one regrowth step yields red LEDs; this regrowth step is performed with a low thermal budget. The low thermal budget may be defined by a maximum temperature Tm, with each sub-step in the step performed below Tm. Tm may be 900° C. or less (e.g., 850° C. or less, 800° C. or less, 750° C. or less, 700° C. or less, 650° C. or less, 600° C. or less, 550° C. or less, 500° C. or less). The low thermal budget may be defined by a maximum temperature Tm and a maximum time tm, with each sub-step in the step performed below Tm, and steps performed at or near Tm lasting less than tm.

In some embodiments, the LED region (or layers thereof) is grown with a pulsed growth technique—for instance, by flowing different group-III precursors (such as TMG and TMI) at different times. This may facilitate the growth of high-In-content layers.

In some embodiments, the LED regrowth occurs on the whole free surface of the base layer. For instance, it occurs on the top and sidewalls of base NWs, in a core-shell geometry, as already shown in FIG. 1B.

In contrast, in some embodiments, LED growth only occurs on some parts of the base layer—for instance, only on the top facets of base NWS, as already shown in FIG. 1A. This may lead to planar active regions along the axis of the NW. The active regions may be disc-shaped, or more generally have the same cross-section as that of the NW.

Various techniques may be employed to achieve this top-only growth. The growth parameters may be selected to promote nucleation on the top surface. For instance, the top surface is a c-plane and the growth conditions promote c-plane nucleation against other planes (e.g., m-plane, c-plane, semi-polar planes). Suitable growth conditions may include temperature, pressure, partial pressure of various precursors, III/V ration, growth rate, use of pulsed growth. In some embodiments, a low temperature is employed to promote top surface growth. The temperature for growing a light-emitting layer may be less than 700° C. (e.g., 675° C. or less, 650° C. or less, 625° C. or less, 600° C. or less, 550° C. or less, 500° C. or less, 450° C. or less, 400° C. or less). A growth technique suited for low temperature growth may be employed (including MBE, sputtering, plasma-assisted CVD, and other CVD techniques suited for low temperature).

The sidewalls may be covered to prevent epi growth on the sidewalls. In some embodiments, a dielectric material (e.g., SiOx, AlOx, SiNx, AlNx, TiOx, TaOx, ZrOx) is deposited on the sidewalls. It may cover all the sidewalls, or cover nearly-all the sidewalls, and leave the top region of the NWs free for growth.

FIGS. 11A-11F shows a process flow to cover NW sidewalls. FIG. 11A shows a base region NW 1110 after base region 1100 growth. In FIG. 11B the NW 1110 is coated with a dielectric material 1120; in this case the deposition is conformal (which may be obtained with atomic layer deposition and other known processes). In FIG. 11C the top of the dielectric material 1120 is removed exposing a top surface 1130 of NW 1110. This may be achieved by techniques including: mechanical processes (e.g., grinding, polishing), including a selective mechanical process having a faster etch rate for dielectric than for the semiconductor; dry etching (e.g., RIE, ICP), including a directional dry etch process (which etches the top surface of the dielectric material faster than its sidewalls, and may be achieved by selecting the parameters of the etch [pressure, composition, powers] appropriately) and a selective dry etch process having a faster etch rate for dielectric than for the semiconductor. The final geometry before regrowth may vary. FIG. 11D shows a case where the dielectric 1121 is etched below the top surface 1130. FIG. 11E shows a case where the dielectric 1122 extends above the top surface 1130. FIG. 11F shows a case where the dielectric 1123 is not conformal and extends around the NWs 1110.

In the case of FIG. 11D, some lateral growth may occur on the sidewalls (or slanted walls if present) where they are exposed. In some embodiments, it is desirable to limit the amount of lateral growth. Accordingly the recess of the filler material may be small enough that the protruding part of the NW is small, e.g., less than 100 nm (e.g., 50 nm or less, 25 nm or less, 10 nm or less, 5 nm or less).

In some embodiments, lateral growth occurs and the growth conditions are selected to reduce the In incorporation and/or growth rate for lateral growth, such that lateral growth occurs but In-containing layers (i.e., QWs) have less In or are thinner on the NW sides than on the NW top. For instance, a QW on the top surface has a thickness t and an In composition x and the corresponding layer on the side-wall has a thickness less than t*0.8(or 0.5) and/or a composition less than x*0.8 (or 0.5). This may preclude light emission and/or absorption by the lateral material.

As already disclosed, the regrowth surface may be pre-pared for regrowth (i.e., to be epi-ready). Such preparation steps may occur before or after the dielectric coating steps described here.

Other materials than dielectrics (e.g., metals) may be used to cover the NW. Various portions of the NW may be coated to prevent them from regrowth nucleation: sidewalls, top portion, slanted walls, semipolar facet. In some embodi-ments, some crystalline facets are coated and others are not, facilitating regrowth. In some embodiments, the uncoated facets are c-plane (or m-plane, a-plane, semipolar). Depend-ing on the crystal orientation of the structure, various planes may correspond to the top facet.

In some embodiments, layers of the LED region are configured to achieve specific polarization fields and control the overlap of electron and hole wavefunctions (WF) in the light-emitting layers. For various crystal directions, III-nitride heterostructures display polarization fields, both spontaneous and strain-induced. The fields have various effects, including: separation of the WF overlap (which may be detrimental to radiative efficiency), increase of the emis-sion wavelength (which may be beneficial, especially to reach a longer wavelength with a given material composi-tion). Accordingly, embodiments of the invention may seek a field with a given strength, or in a given range, to mitigate the trade-off between these effects. In some embodiments, the magnitude of polarization fields in the active region is reduced thanks to the reduction in strain (for instance, an In0.3GaN QW has a lower polarization field when pseudo-morphic to an In0.1GaN base region than when pseudomor-phic to a conventional GaN layer). In some embodiments, the layers around the active region are selected to manipu-late the strain difference and therefore the field. For instance, the active region may include an $In(x)Ga(1-x)N$ light-emitting QW, and at least one layer next to the QW (e.g., a barrier) which includes $In(y)Ga(1-y)N$ with y<x, or GaN, or AlGaN, or AlInGaN. In some embodiments, the barriers between QWs are composed of multiple layers—for instance, the stack between two QWs may be (with either the p- or the n-side being on the left):

InGaN QW/InGaN/InGaN/InGaN QW

InGaN QW/InGaN/GaN/InGaN QW

InGaN QW/InGaN/AlGaN/InGaN QW

InGaN QW/GaN/AlGaN/InGaN QW

In some embodiments, a QW has a polarization field in a range 1-4 $MVcm^{-1}$ (e.g., 1-2, 2-2.5, 2.5-3, 3-4 $MVcm^{-1}$). The polarization field may be selected together with the thickness (since their product equals the voltage drop across a QW). In some embodiments, the product of QW thickness and polarization field across a QW is in a range of 0.1-1V (e.g., 0.1-0.3V, 0.25-0.5V, 0.5-0.75V, 0.75V-1V, less than 1V, less than 0.5V, less than 0.3V). In some embodiments, the aforementioned values are obtained despite the QW having a composition $In(x)Ga(1-x)N$ with x>0.2 (e.g., >0.25, >0.3, >0.4). In an embodiment, a QW has a compo-sition $In(x)Ga(1-x)N$ with x>0.3 and a thickness t>1 nm; it is grown pseudomorphically on a base layer with composi-tion $In(y)Ga(1-y)N$ with y>0.05; and the voltage drop across the QW is less than 0.5V thanks to a proper configuration of parameters including: y, t, and the composition of layers surrounding the QW.

Some embodiments include an underlayer, e.g., a layer configured to improve the IQE of the active region by incorporating defects. The underlayer may include In; it may be a continuous InGaN or AlInGaN or AlInN layer; or a superlattice of In-containing compounds. Alternatively, embodiments may not require a separate underlayer, if the In concentration of other layers (i.e., base layer, InGaN n-lay-ers and barriers) already captures point defects effectively.

Figures 12A, 12B:
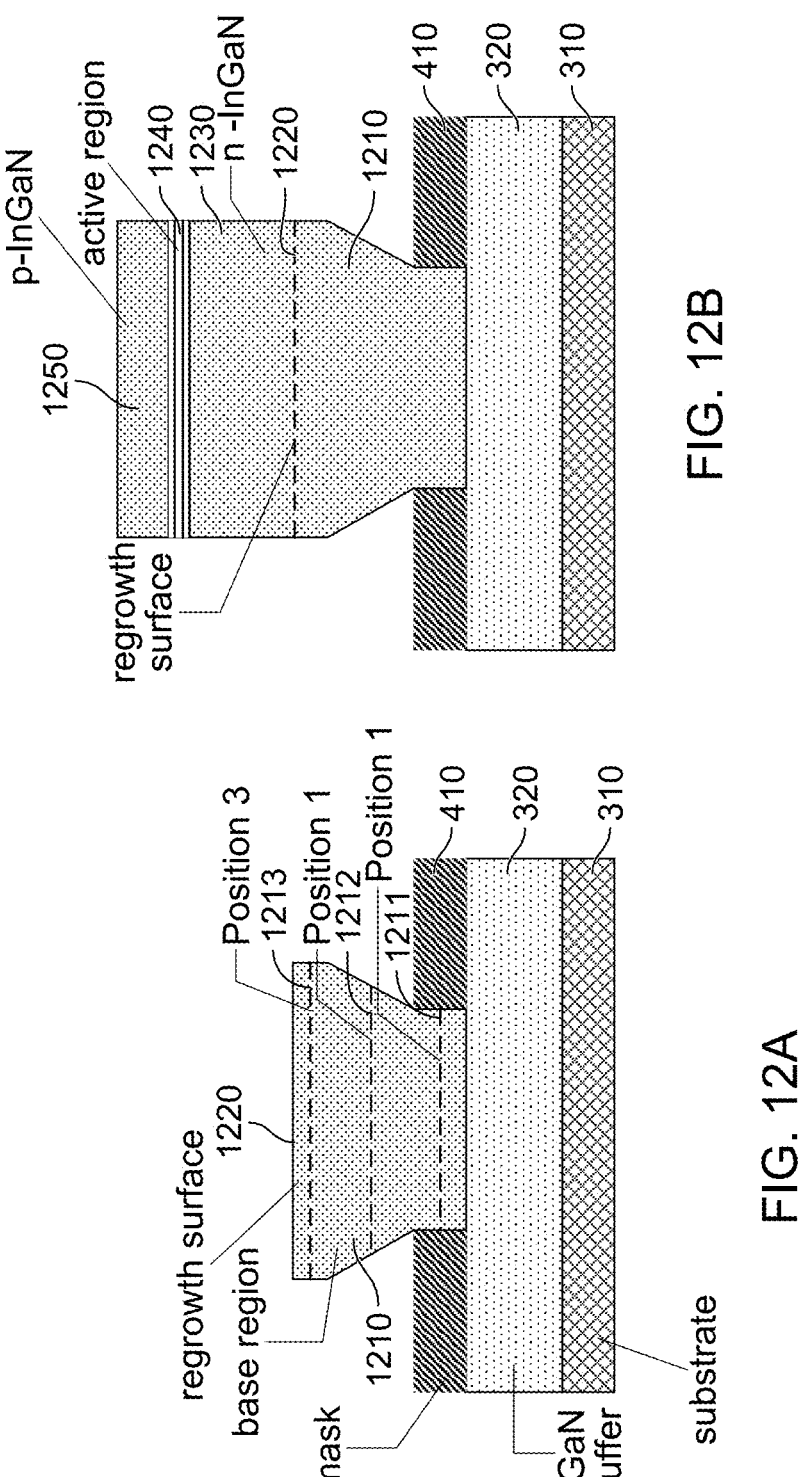
FIG. 12A and FIG. 12B are cross-sectional diagrams showing geometry and strain state of an example LED emitter.

FIGS. 12A-12B illustrates the geometry and strain state of an embodiment. FIG. 12A shows the structure after growth of a base region 1210. A GaN buffer 320 with a mask 410 is provided on a substrate 310, and an InGaN base region 1210 is grown in the mask openings. As the growth of the base region 1210 proceeds, its strain relaxes. Here this is shown as a lateral expansion, although other relaxation mechanisms are possible as disclosed herein. The base region 1210 ends with a relaxed regrowth surface 1220. At various positions along the growth direction, the lattice constant increases. For instance, in the mask opening (posi-tion 1211), the growth is pseudomorphic and the in-plane lattice constant is that of the GaN buffer. At an intermediate position 1212, relaxation is partial and the in-plane lattice constant is in-between that of bulk GaN and bulk InGaN. At position 1213, the material is fully relaxed and the in-plane lattice constant is that of bulk InGaN. FIG. 12B shows the regrowth of the LED region over the regrowth surface 1220, including n-InGaN 1230, active region 1240 and p-InGaN 1250. The LED region may be pseudomorphic with the regrowth surface 1220, i.e. it may have the same in-plane lattice constant as at position 3 (with some tolerance, such as +/−0.1% lattice constant value).

Figures 13A, 13B, 13C:
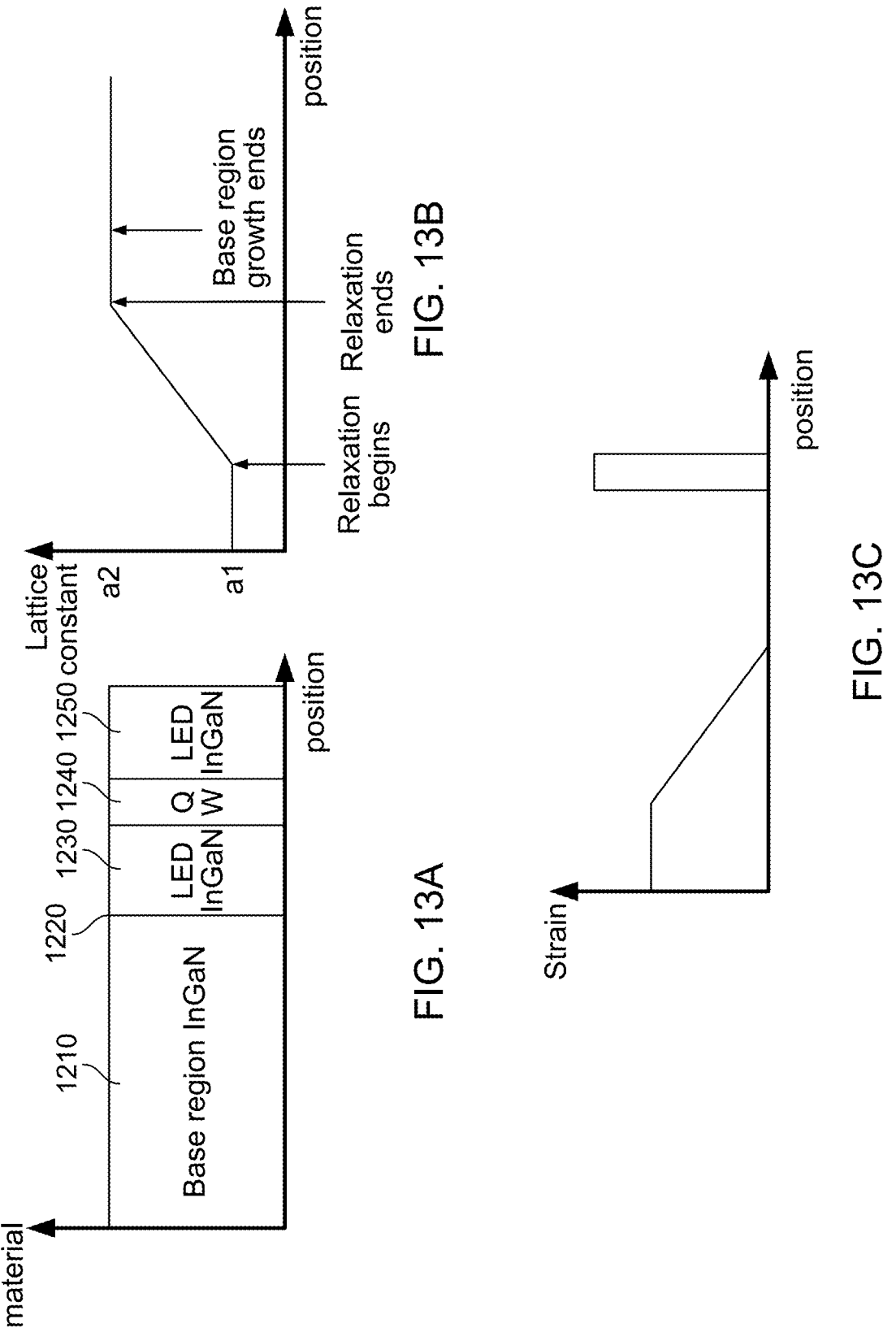
FIGS. 13A-13C show the evolution of various quantities when a NW LED emitter is grown according to FIGS. 12A-12B.

FIGS. 13A-13C show the evolution of various quantities when a NW is grown according to FIGS. 12A-12B. FIG. 13A shows the layers: base layer 1210, and LED layers 1230, 1240, and 1250 (including layers with the same composition as the base layer, and a QW with higher In composition). FIG. 13B shows the evolution of the in-plane lattice constant along the axis of the NW, beginning in the base region 1210. At first the base region is pseudomorphic with the GaN buffer (lattice constant a1); then relaxation begins and the lattice constant increases towards its bulk value (lattice constant a2), whereupon full relaxation is reached. The base region growth ends, and is followed by pseudomorphic growth of the LED region. FIG. 13C shows a simplified sketch of the corresponding strain. The strain reduces during relaxation of the base layer. The strain increases in the QW, due to its higher In content.

The dimensions of NWs (or other lateral structures) may be selected to facilitate relaxation. In some embodiments, a NW has a diameter (or a typical lateral dimension) less than 200 nm (e.g., 150 nm or less, 120 nm or less, 100 nm or less, 80 nm or less, 50 nm or less). A small diameter may facilitate lateral relaxation. In some embodiments, several groups of lateral structures are present on a base surface, and are characterized by different relaxation levels; this may be facilitated by their different dimensions. In some embodiments, three groups of NWs are present, with three different typical lateral dimensions; the NWs with larger dimensions have less relaxation; in such embodiments the three groups may correspond to blue, green, and red pixels; it may be advantageous to have larger relaxation for the red pixels and lower relaxation for the blue pixels.

In some cases, the relaxation in the base region is not due to lateral expansion, but to other effects such as formation of defects (including stacking faults, dislocations, vacancies, interstitials and other defects) and/or voids. The relaxation may start immediately, with little or no pseudomorphic InGaN material grown on the GaN buffer. Sometimes the relaxation is incomplete, and the regrowth surface has a lattice constant that is less than that of bulk InGaN with the same composition. The difference in lattice constant between the regrowth surface and bulk material at the same composition may be less than half of the difference in lattice constant between bulk GaN and bulk material at the same composition.

Figure 14:
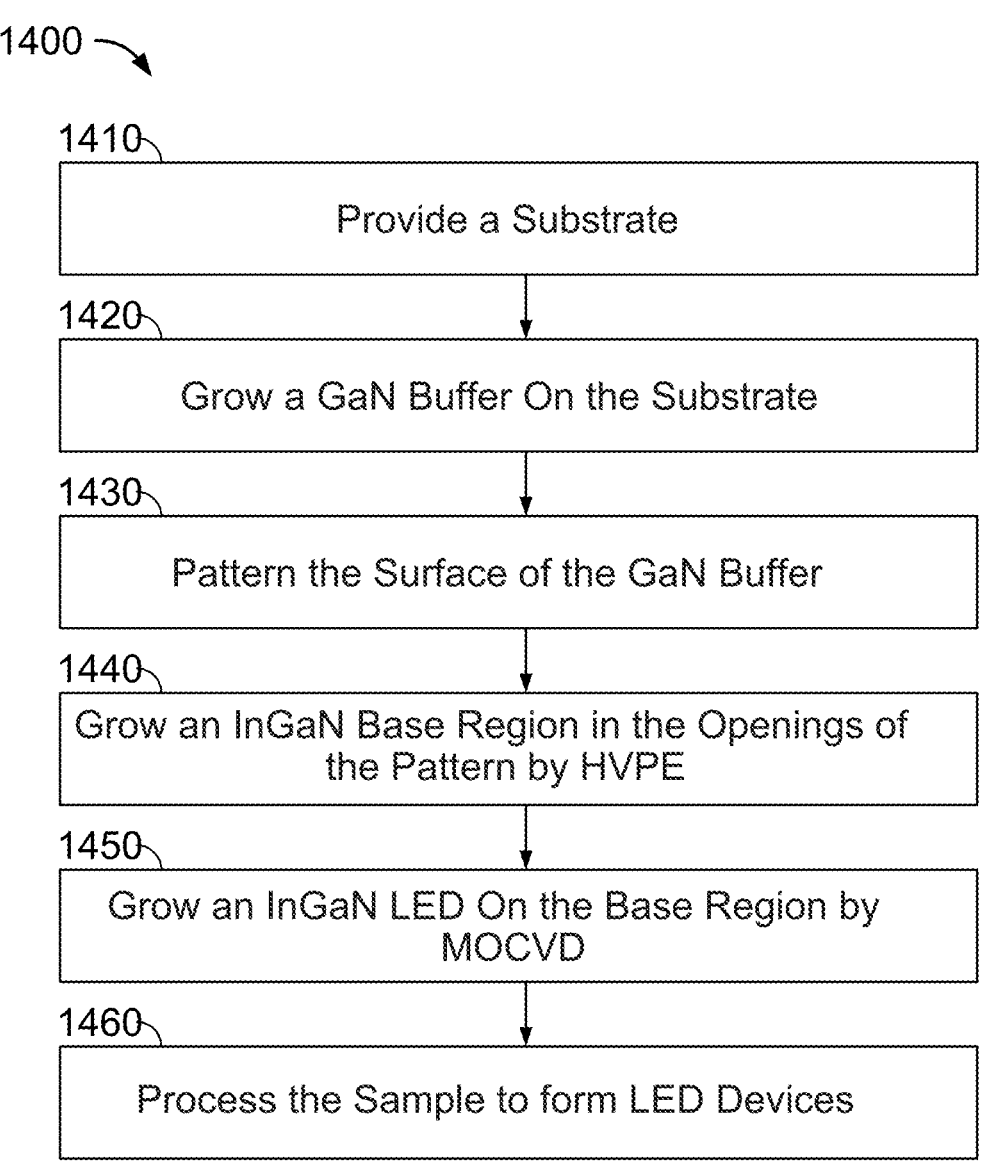
FIG. 14 is a flow chart showing steps in an example process for forming LED devices.

FIG. 14 shows an example process flow 1400 for obtaining LEDs according to embodiments. In step 1410, a substrate is provided. In step 1420, a GaN buffer is grown on the substrate. In step 1430, the surface of the GaN buffer layer is patterned. In step 1440, an InGaN base region is grown in the openings of the pattern by HVPE. In step 1450, InGaN LEDs are grown on the base region by MOCVD. In step 1460, the sample is processed further to form LED devices. Some steps are optional, and some steps could be omitted or re-ordered.

In some embodiments, an etch step is performed to remove epitaxial material from the LED region after growth. The etch step may be a selective chemical etch, including KOH, $H_3PO_4$ and other etches, and may etch some crystal planes faster than others; it may be a dry etch (including ICP, RIE); it may be a photo-chemical or electro-chemical or photo-electro-chemical etch. The etch may etch non-polar facets (including m and/or a) fast, and may etch c-plane facets (including +c) slowly. This may be used to remove sidewall material from a NW or mesa, without removing top material.

In some embodiments, the LED region growth occurs conformally, with material grown on the top and sides of a NW (or mesa). An etch step is then performed to remove the sidewall material while leaving the top material. The etch step may be performed until the p-type material and active region material of the sidewall have been removed. It may expose the n-type material of the LED region, or the material of the base region. The top surface may be covered or otherwise protected before the etch step, such that only the sidewall material is removed. The structure after etch may have substantially vertical sidewalls. The etch may be selected to result in a high crystal quality with low defects (e.g., dangling bonds), to reduce sidewall recombinations. The sidewall may further be passivated (e.g., by a dielectric layer) after growth to reduce recombinations. The etch may be employed to control the lateral dimensions of the lateral structure. In some embodiments, the etch removes defective material from the sidewalls. The sidewall material may have a defect (including threading dislocation, misfit dislocation, dangling bond) and the etch may remove material until the defect is absent from the NW.

In some embodiments, the etch removes material which emits at an unwanted wavelength. In one example, a NW has a light-emitting region perpendicular to its axis (e.g., a disk-like active region in the case of a circular NW), and the emission wavelength of the active region is inhomogeneous radially (i.e., it varies from center to edge), resulting in a first FWHM of emission; the etch removes material near the periphery, resulting in a second FWHM narrower than the first. In another example, the LED region growth is conformal and the top and sidewalls of the active region emit at different wavelengths; the etch removes sidewall material so that emission only comes from the top part of the active region. The etch may form nano-porous material. In some embodiments, the etch facilitates strain relaxation. For instance, the etch removes lateral material, which shrinks the NW diameter and facilitates lateral lattice expansion for the active region, and reduced strain.

Epitaxial layers may have tensile or compressive strain. In some embodiments, an $In(x)Ga(1-x)N$ layer, grown on GaN or on an $In(y)Ga(1-y)N$ layer with x>y, has a compressive strain. Layers with tensile strain may be grown in the vicinity of layers with compressive strain, to balance the strain. Tensile strain may for instance be achieved by adding Al to a III-nitride compound (e.g. using an AlGaN layer, an AlInN layer, an AlInGaN layer with appropriate composition). For instance, an AlGaN barrier may be grown in the vicinity of an InGaN quantum well. In some embodiments, a layer with a compressive misfit strain e1 is grown in the vicinity of a layer with a tensile strain e2, and 0.25<|e1/e2|<4 (e.g., 0.5<|e1/e2|<2). A vicinity may be 10 nm or less (e.g., 5 nm or less, 2 nm or less, 1 nm or less).

Geometry

Some embodiments include NWs or mesas or platelets. One or another of these configurations may be picked as an example hereafter, but the teachings apply generally.

The top surface of the wires may be substantially flat. For instance, the transition from sidewall to top surface occurs with no slanted sidewall or a slanted sidewall of limited extent (such as less than 20 nm, less than 10 nm, less than 5 nm, less than 3 nm)

FIGS. 15A-15D shows cross-section of NWs (or platelets) along their axes 1501, according to some embodiments. In FIG. 15A a NW 1510 has a vertical cross section, its sidewalls 1511 being parallel to the axis 1501. In FIG. 15B a NW has a cross-section with slanted sidewalls 1521 and an active region 1522 grown only in the plane perpendicular to the NW axis 1501. In FIG. 15C, a NW 1530 has slanted sidewalls 1531 and growth of the LED active region 1532 has occurred along all facets (core-shell structure). In FIG. 15D, a NW 1540 has core-shell structure but a masking layer 1545 precludes growth along part of the sidewalls. Depending on the masking layer 1545 dimensions, a large fraction of the LED active region 1542 may be grown on the planar facet, with little growth along the other planes.

The NW may be grown substantially along the 0001 (+c) direction, or along the 000-1 (−c) direction. It may be substantially free of domain inversions (i.e., domains where the polarity switches between +c and −c). In some embodiments, at least 90% (e.g., 95% or more, 99% or more) of the top surface of the base region is of a constant polarity.

The height of the NW may be in a range from 10 nm to 10 microns (e.g., 10 nm-1 micro, 100 nm-10 micron, 100 nm-3 micron). The diameter (or typical lateral dimension) of the NW may be in a range from 10 nm to 1 micron (e.g., 10-100 nm, or 10 nm-500 nm, or 30 nm-1000 nm, or 10 nm-300 nm).

Some embodiments include micro-platelets (i.e., they have lateral structures with lateral dimensions on the order of one or a few microns).

Figures 16A, 16B, 16C:
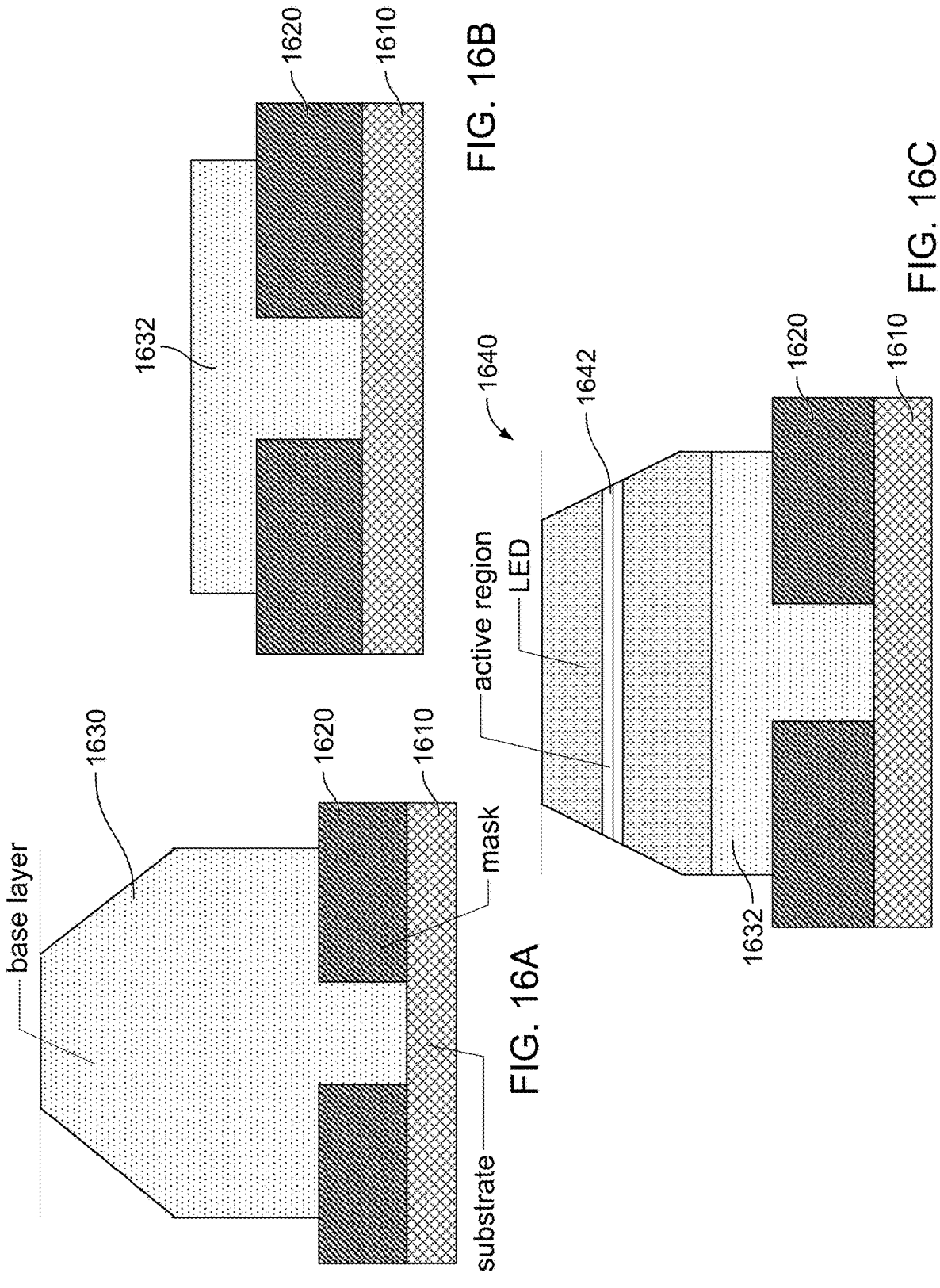
FIGS. 16A-16C are cross sectional diagrams showing steps in an example fabrication process for platelet LEDs.

FIGS. 16A-16C shows an example fabrication process for platelet LEDs, according to embodiments. In FIG. 16A, a substrate 1610 with selective growth openings in a mask 1620 is provided, and a relaxed base layer 1630 is grown. The substrate may be, e.g., GaN or Si or Si with an AlN nucleation layer or sapphire. The base layer 1630 growth starts in the openings of the mask 1620. The base layer 1630 undergoes relaxation, as taught herein. Growth along lateral directions is promoted, for instance by selecting appropriate growth conditions. At the end of forming the structure shown in FIG. 16A, the base lateral structure may have a lateral dimension of about one or a few microns, or in a range from 500 nm to 10 microns (e.g., 1 micron-5 microns, 500 nm-10 microns, 1 micron-3 micron). It may not be planar, due to the growth mode. Accordingly, a planarizing step may be used as shown in FIG. 16B to result in a planar layer 1632 with desired morphology as taught herein. In FIG. 16C a micro-LED structure 1640 is grown on the base region 1632 as taught herein. In this illustration the LED has a planar active region 1642 which extends to the edges of the micro-LED.

The micro-LED may have vertical or slanted sidewalls (for instance, corresponding to semipolar planes). In some embodiments, the active region extends substantially to the edges of the micro-LED but the configuration of the active region varies laterally. The thickness of an active layer may decrease near the edge of the platelet. The thickness of an active layer at the edge of a platelet may be less than 90% (e.g., 80% or less, 50% or less) of the thickness of the same active layer at the center of the platelet. The composition of an active layer may decrease near the edge of the platelet. The In composition of an active layer at the edge of a platelet may be smaller than the In composition of the same active layer at the center of the platelet by at least 1% (e.g., 2% or more, 5% or more).

Such variations may facilitate a reduced injection of carriers near the edges of the platelet. In some embodiments, an exclusion region exists around the edge of the platelet LED. The area of the exclusion region may be between 5% and 50% of the total area of the active region; it may be at least 5% (e.g., 10% or more, 20% or more, 30% or more) and less than 50% (e.g., 30% or less, 20% or less). Less than 20% (e.g., 10% or less, 5% or less, 1% or less) of the total emitted light may originate from the exclusion region.

Figures 17A, 17B, 17C, 17D:
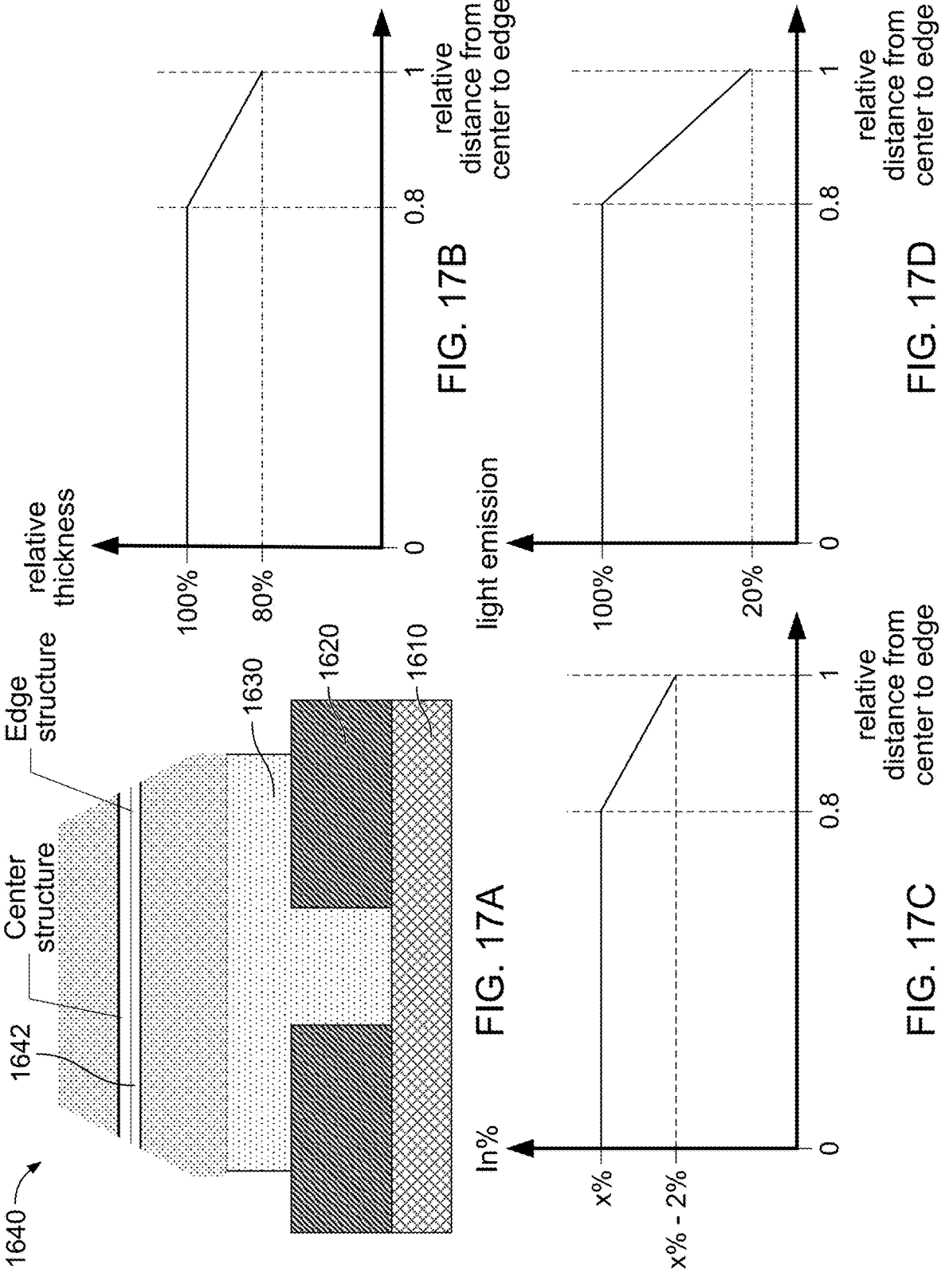
FIG. 17A is a cross-sectional diagram showing an example LED emitter.
FIGS. 17B-17D are plots illustrating lateral variations in active region properties, from a center structure to an edge structure, in the example LED emitter shown in FIG. 17A.
Figures 18A, 18B, 18C, 18D:
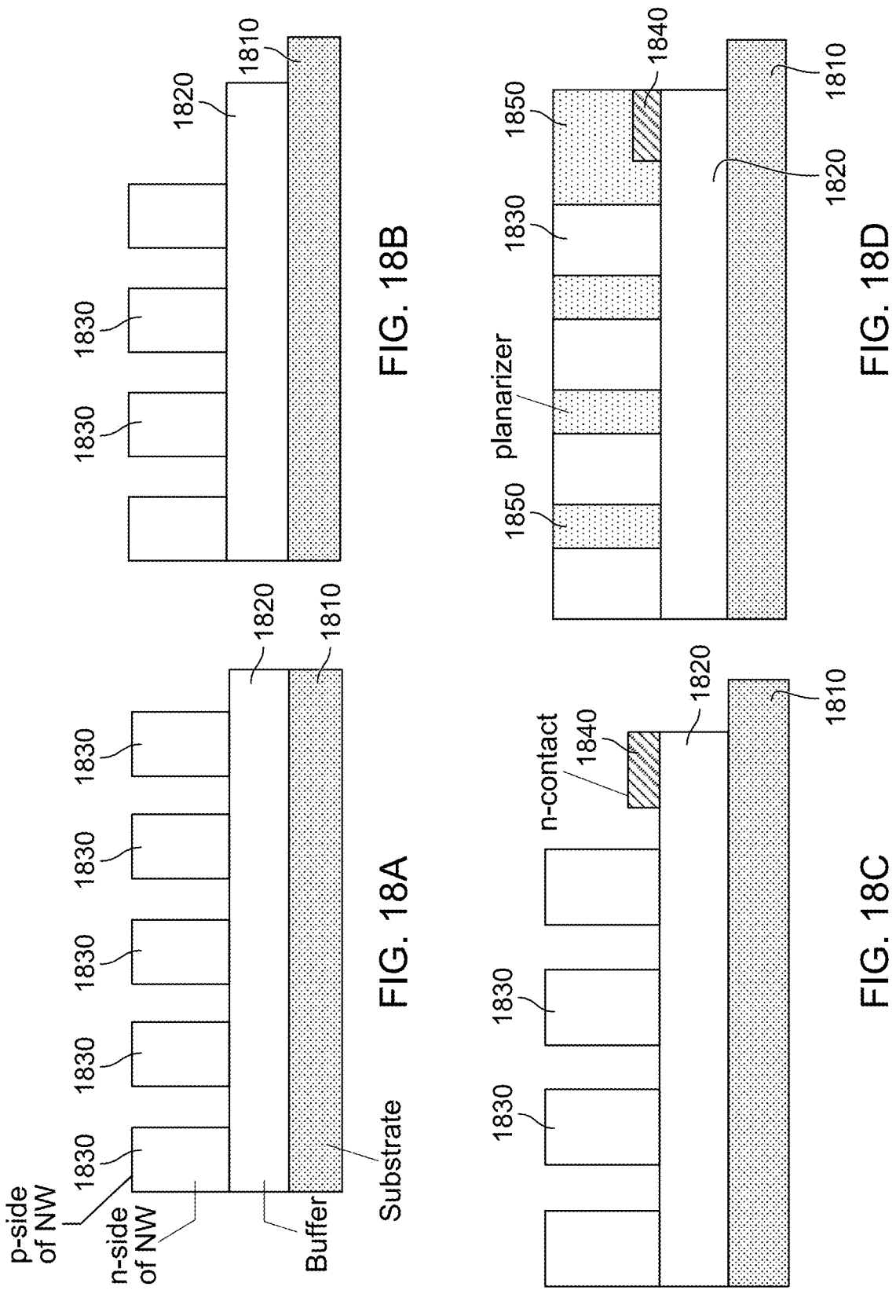
FIGS. 18A-18H are cross-sectional diagrams showing steps in an example process for forming LED emitters.
Figures 18E, 18F, 18G, 18H:
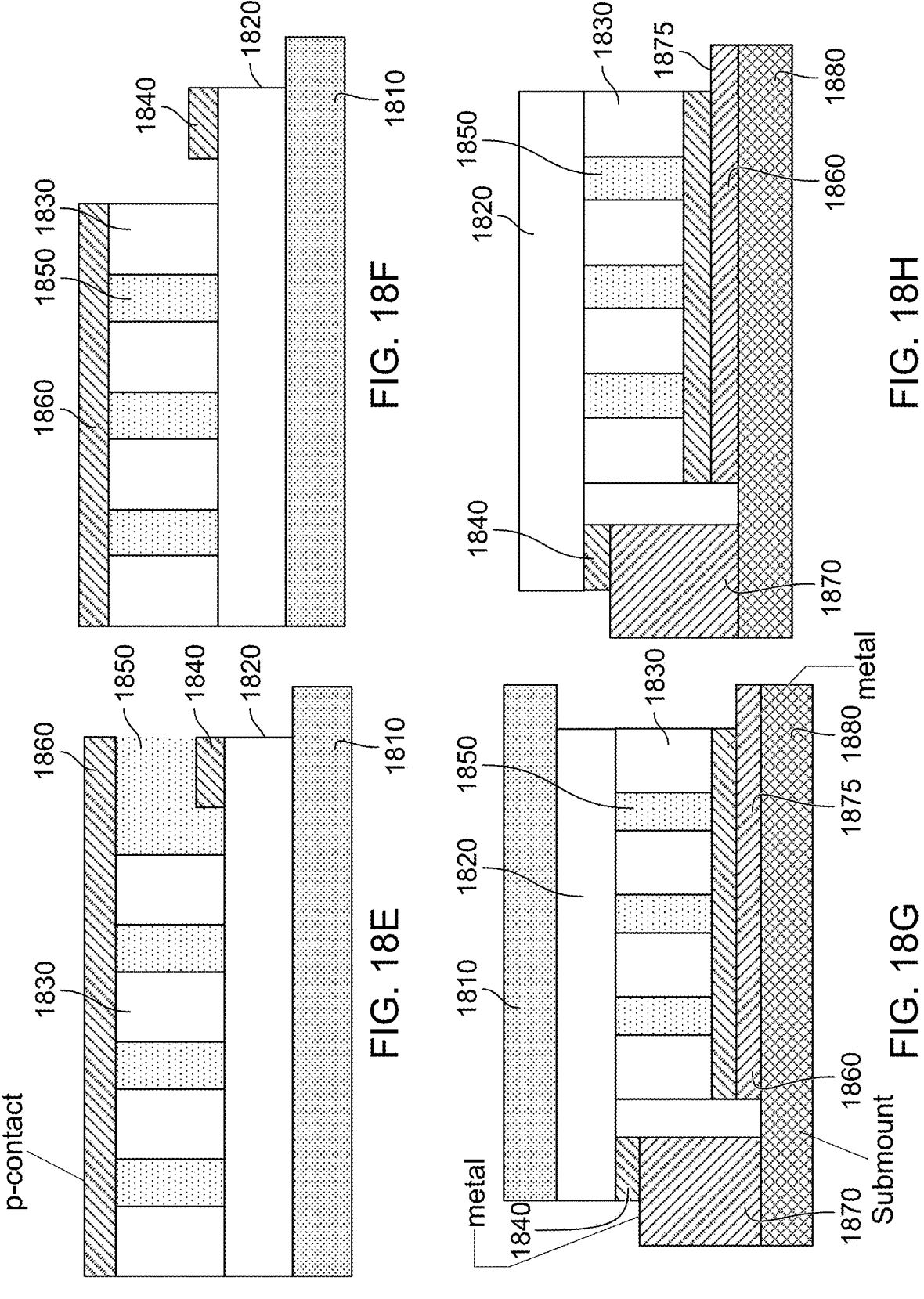
Figures 19A, 19B, 19C, 19D:
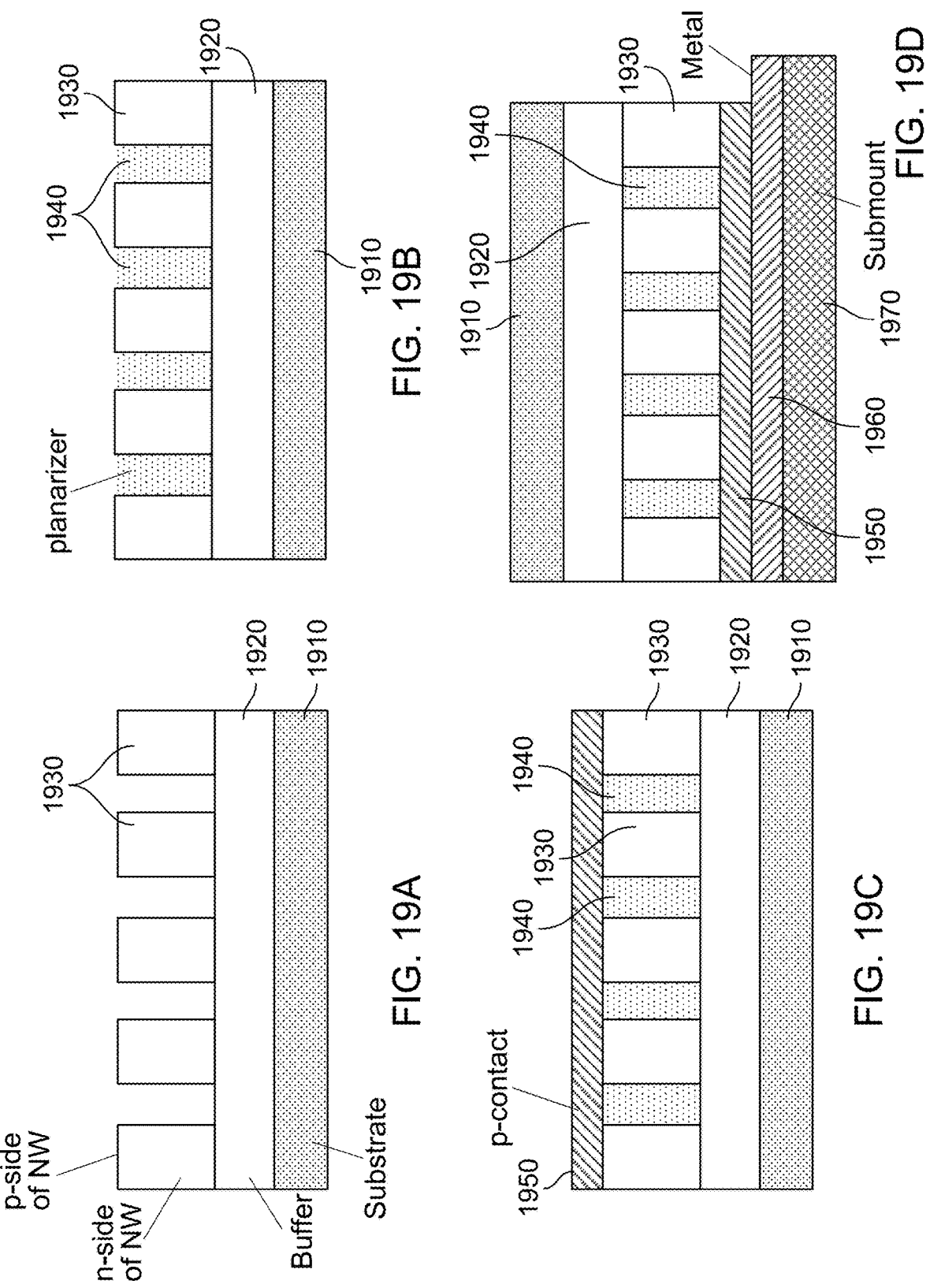
Figures 19E, 19F, 19G:
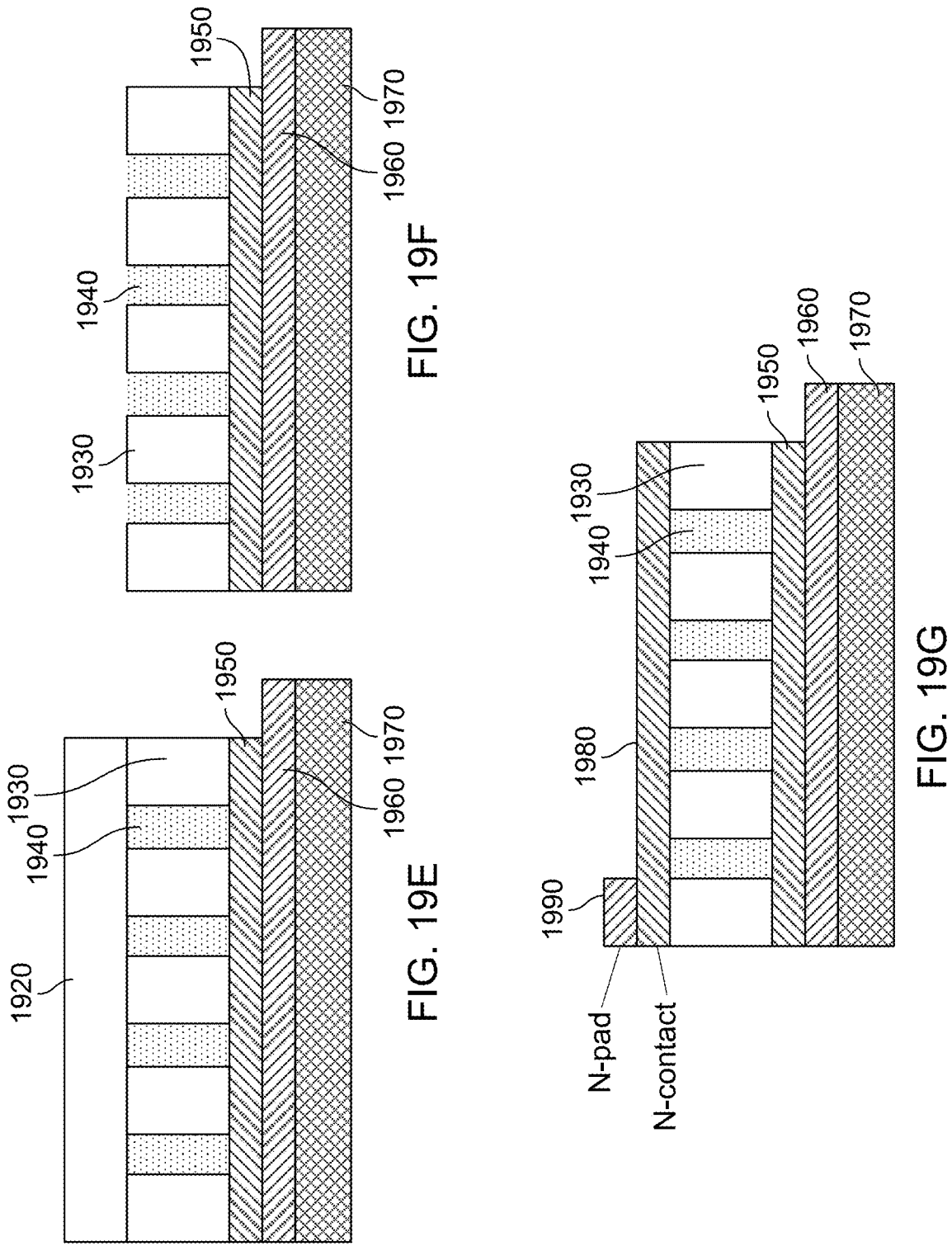

FIGS. 17A-17D illustrate lateral variations in active region properties, from a center structure to an edge structure. FIG. 17A illustrates the center structure and edge structure. FIGS. 17B-17D show how properties may vary from center to edge, as a function of the relative lateral distance (0 being the center and 1 the edge). A property may be substantially constant from the center to a distance (0.8 in this example, but other values are possible such as about 0.7, about 0.9), and then vary from the distance to the edge. The thickness of active layer 1642 may decrease by at least 5% (e.g., 10% or more, 20% or more, 30% or more, 40% or more, 50% or more). The In composition of active layer 1642 may decrease by at least 1% (e.g., 2% or more, 5% or more, 10% or more). The intensity of light emission may decrease by at least 50% (e.g., 80% or more, 90% or more, 95% or more).

In addition to thinning the base lateral structure prior to LED growth, processing steps may be employed to affect the lateral dimensions of the base lateral structure. The lateral dimensions may be reduced, for instance by lithography and etching, by dry or chemical etching, by other methods known in the art.

Platelets of varying dimensions may be formed on a same substrate. In some embodiments, three dimensions are present, and they correspond to red/green/blue emission. In some embodiments, the varying dimensions are obtained by varying the size of the mask openings, which leads to platelets of varying size after base region growth. In some embodiments, the varying dimensions are obtained by selectively reducing the dimensions of some platelets (e.g., by masking some platelets and etching other platelets).

Platelets with base material of varying strain state may be formed on a same substrate. In some embodiments, openings of different sizes are formed in a growth mask before growth of the base material. Smaller openings facilitate a higher degree of relaxation. Larger openings facilitate a lower degree of relaxation.

Varying lateral dimensions or strain state may facilitate a difference in In incorporation during growth of the LED, as taught herein, and may result in the simultaneous growth of LEDs with varying emission wavelengths (e.g., red/green/blue), as taught herein. Differences in strain state may lead to a different lattice pulling effect, with more In being incorporated above base material having lower strain. In some embodiments, an active layer is grown and the difference in ln % across different platelets is at least 5% (e.g., 10% or more, 15% or more). This may facilitate a difference in emission wavelength of at least 50 nm (e.g., 100 nm or more).

Processing

After growth of the base and LED regions, the semiconductor material is processed into LED devices. A variety of known device architectures can be employed, including lateral, vertical, flip-chip.

FIGS. 18A-18H shows an example process flow. (A) NWs 1830 grown on a substrate 1810/buffer layer 1820 are provided. The NWs 1830 have an n-doped region and a p-doped region (with an active region between the n and p regions). (B) The buffer 1820 is etched (e.g., by dry etch) to singulate a subpixel. (C) An n-contact 1840 is formed to n-doped material (the material may be made to part of the buffer as shown, or elsewhere: base region, LED region). (D) a planarizer material 1850 is formed to yield a planar surface along the top surface of the NWs 1830. The planarizer 1850 may be a dielectric deposited by various known techniques (e-beam, CVD, PEVCD, ALD) or a cured fluid or a spin-on material (e.g., spin-on glass). It may be thinned back to expose the p-side of the NWs. (E) a p-contact 1860 is formed on top of the NWs 1830. The n- and p-contacts may be transparent (e.g., TCO contacts) or reflective (e.g., comprising metal layers). (F) The p-contact 1860 and planarizer 1850 are removed to open access to the n-contact 1840. The device of (F) may be used as-is, with contact made to the n-contact 1860 and p-contact 1840. It may be a top- or bottom-emitting device (depending whether the substrates and contact are opaque or transparent). (G) Alternatively, the device is flip-chipped to a submount 1880 having metal interconnects 1870 and 1875. The interconnects may be of various geometries (here they are shown as surface layers/columns, but they could be through-vias, interconnects embedded in the submount such as redistributing interconnects, and other geometries known in the art). The interconnects 1870 and 1875 can then be connected to an electrical driver to drive the various subpixels. (H) If needed, the substrate 1810 is removed. For instance, this is useful if the substrate is opaque or if its presence perturbs the optics of the system. Substrate removal can be achieved by various techniques: wet etch; dry etch; mechanical etch (e.g., grind, polish); laser lift-off; photo-chemical or electro-chemical or photo-electro-chemical etching; and combinations thereof. This is only an exemplary process, and variations and substitutions are possible. For instance, the n-contact may be formed on top of the subpixels after step H, resulting in a vertical LED geometry; in this case, a member may then be attached to the top of the assembly after the n-contacts are formed to provide a current path. Various materials in the assembly may be transparent, including the substrate, submount, contacts, and aforementioned member—accordingly, light emission is possible through either side of the assembly.

FIGS. 19A-19G shows another example process flow. (A) NWs 1930 grown on a substrate layer 1910/buffer layer 1920 are provided. (B) planarizer material 1940 is formed between the NWs 1930. (C) a p-contact 1950 is formed above the NWs 1930. (D) The wafer is flip-chipped to a submount 1970 having metallic interconnects 1960. (E) The substrate 1910 is removed. (F) The buffer 1920 is removed (e.g., by laser lift-off). (G) n-contacts 1980 and pads 1990 are formed on the n-side of the NWs 1930. This is only an exemplary process, and variations and substitutions are possible. For instance, the substrate 1910 may be transparent, and it may be removed in the same step as the buffer (for instance a laser-lift-off step). The n-pad 1990 may be formed to connect the n-contact 1980 to a metal trace on the submount (for instance by using a directional deposition which forms the n-contact to the sidewall of a passivated NW).

Various techniques can be employed to remove the buffer and expose the n-side of the NWs such as: a selective chemical etch; a grind and polish process; a dry etch process; a laser lift-off (LLO) process; a mechanical break/cleave; an ion-implantation and break/cleave (akin to a smart cut process); a laser ablation or micro-ablation process (e.g., stealth process), possibly followed by a mechanical break.

In some embodiments, the buffer has a larger bandgap than the NW—for instance, the buffer is GaN and the NW has an InGaN region. This facilitates selective LLO using a radiation source (such as a pulsed laser) which is not absorbed by the buffer but is absorbed by the NW. For instance, the wavelength is 390 nm, which is not significantly absorbed by GaN but is significantly absorbed by In0.1GaN. In some embodiments, a specific layer of the NW has a high In composition and is absorbing, whereas other InGaN layers of the NW are not absorbing. For instance, the NW has a core region with In0.1GaN, and a sacrificial layer with In0.2GaN. LLO is performed with a laser which is absorbed by In0.2GaN but not by In0.1GaN. The sacrificial layer may be grown during the LED region growth.

A photo-chemical etch (or photo-electro-chemical etch) may also be used, with a layer of a specific composition having high absorption for the photons and prone to the etch. The transparency/absorption refers to the wavelength used in the etch step. For instance, an embodiment has a transparent substrate, a transparent layer (e.g., GaN), a base InGaN layer with a large absorption, and LED layers. The structure is illuminated through the substrate (which may be polished and/or have an optical finish). The illumination goes through the transparent layer and is absorbed by the base layer, causing etching of the base layer.

A wet etch may be used to remove the buffer or the substrate (including if the substrate is Si).

In some embodiments, several techniques are used successively. For instance, a LLO process is used to remove the buffer, exposing a portion of the NWs. A material-removing step (e.g., mechanical polish, dry etch . . . ) is then used to thin down the exposed NWs to a desired thickness, before a contact is made to the polished NWs. The NWs may be thinned to obtain a planar surface. The NWs may be thinned to reach a doped layer. In some embodiments, a part of the NW is undoped and a part is doped; a material-removing process is employed to remove undoped material and reach the doped material.

In some embodiments, the base region may include voids (for instance, the base of the NWs may have voids). This makes the connection of the NWs to the underlying layer weak, and the NWs are amenable to breaking near the voids.

In some embodiments, a surface preparation step is employed on a doped surface of the NWs before a contact is formed to the doped surface. The treatment may include a clean (including by a solvent, an acid, a base), a wet etch, a dry etch. The surface may be n-doped; the treatment may be a dry etch containing O or Si which facilitates higher doping of the surface, thereby causing a lower contact resistance when the contact is formed to the surface. In some embodiments, a surface-prepared region has a higher doping than the semiconductor before surface preparation. In some embodiments, a surface of an InGaN base region is exposed; the base region has a doping level D (e.g., about 1E16, 5E16, 1E17, 5E17, 1E18, 5E19, 1E19) after epitaxy; the surface treatment increases the doping to at least 10 times D. This may provide good contact resistance despite moderate doping during growth. The moderate doping may be desirable e.g., to limit doping-induced strain. The base region doping level may be selected to ensure low-enough resistivity of a NW subpixel at a desired current density. In some embodiments, the maximum operation current density is moderate (e.g., less than 50 A·cm$^{-2}$ or 10 A·cm$^{-2}$ or 1 A·cm$^{-2}$ or 0.1 A·cm$^{-2}$); therefore, a moderate doping level may be acceptable.

Miscellaneous

While parts of this disclosure discusses NW LEDs, some of the teachings apply to LEDs which do not feature NWs. For instance, a mesa LED (also called platelet, as disclosed herein) may be employed in lieu of a set of NWs. The mesa may have small dimensions (e.g., 10 microns or less, 5 microns or less, 3 microns or less) and be a subpixel. The mesas may be formed by growth of a base region having patterned mesas and regrowth of an LED region. Strain relaxation may be achieved in small mesas, as disclosed herein.

Although reference is made to InGaN layers, it should be understood that other compounds may be suitable (e.g., AlInGaN, AlInN) so long as they provide a suitable strain. For instance, the base region of a NW may be AlInN having an in-plane lattice constant equal to that of InGaN with a desired content; such a base region reduces the lattice mismatch with InGaN light-emitting layers, as would happen for an InGaN base region. The present teachings can also be applied to other material systems than the III-Nitride system, including III-V and II-VI compound semiconductors.

For instance, other crystals (including semiconductors and insulating crystals) with a suitable lattice constant may be used as base material to achieve reduced active region strain as disclosed herein. In some embodiments, a substrate material has a crystal symmetry and a lattice constant which facilitate the growth of InGaN with a reduced strain. The symmetry may be hexagonal (including a wurtzite symmetry). The lattice constant may facilitate a misfit strain less than half of the misfit strain for pseudomorphic growth on GaN. In some embodiments, an InGaN base layer is grown on the substrate material and an InGaN active region is grown on the InGaN base layer. The InGaN base layer may be substantially relaxed or pseudomorphic with the substrate material. The base layer may have a base layer In composition, and the active region may have an active region In composition, wherein the active region In composition is higher than the base layer In composition by at least 3% (e.g., 5% or more, 8% or more, 10% or more, 12% or more, 15% or more, 20% or more, 25% or more, 30% or more).

The in-plane lattice constant generally refers to the lattice constant in the direction perpendicular to the growth. For instance, in the common case where a wurtzite material is grown along the c-axis (or a direction close to the c-axis), the in-plane lattice constant refers to the lattice constant perpendicular to the c-axis.

When element compositions are disclosed herein, they should be understood as fractional compositions of elements of a given group (e.g., column III or column V), as is generally practiced. For instance, In0.2GaN stands for In0.2Ga0.8N, with the sum of the In and Ga atom numbers being equal to the N atom numbers.

Some embodiments have lateral structures (e.g., mesas or NWs) whose cross-section is not circular (e.g., square, rectangle, hexagon, ellipse . . . ). Such structures can nonetheless be characterized by a typical lateral dimension: if the cross section has an area A, the typical lateral dimension is defined herein as 2*sqrt(A/pi). This definition coincides with the diameter for a circular cross-section.

The LED emitters described herein may be used in displays, including micro-displays. A micro-display typically has multiple pixels, each having a red, a green and a blue subpixel. The distance between two pixels may be less than 20 μm (e.g., 15 μm, 10 μm, 7 μm, 5 μm, 3 μm). The distance between two subpixels may be less than 10 μm (e.g., 7.5 μm, 5 μm, 3.5 μm, 2.5 μm, 1.5 μm). A micro-display may be integrated in a display system, such as an augmented or virtual reality headset. Individual subpixels of a display may be operated electrically to emit light and form an image.

Strain, strain relaxation, lattice constants can be measured by techniques known in the art. This include X-ray diffraction, X-ray Reciprocal Space Map (RSM), grazing incidence X-ray, transverse electron microscopy, Raman spectroscopy and other techniques known in the art. For instance, an RSM measurement along an appropriate direction (such as the (10-15) direction in III-Nitrides) can indicate whether a layer is pseudomorphic, partially or fully relaxed, and enable a measurement of the in-plane lattice constant.

Such measurements also define a degree of relaxation for a second material grown on a first material, as is known in the art. A layer that is pseudomorphic is 0% relaxed; a layer having an in-plane lattice constant equal to its bulk equilibrium value is 100% relaxed; a layer grown on a first material whose lattice constant is halfway between the first material (e.g., GaN) and its equilibrium value is 50% relaxed. In other words, relaxation degree=(a2−a1)/(a2_relaxed−a1)

Accordingly, embodiments provide an InGaN material (e.g., a base layer as taught herein) with a sufficient In composition (e.g., at least 5%, 10% or more, 15% or more, 20% or more, 25% or more, 30% or more) and with a sufficient relaxation degree with respect to GaN (e.g., at least 30%, 50% or more, 60% or more, 70% or more, 80% or more). A surface of the InGaN material/base layer may provide such a relaxation. Additional layers may be grown on top of the relaxed surface, for instance light-emitting layers/quantum wells. Such active layers may have a sufficient In composition (e.g., at least 20%, 30% or more, 35% or more, 40% or more, 50% or more, 60% or more) and a limited relaxation degree with respect to the InGaN material (e.g., 50% or less, 40% or less, 30% or less, 20% or less, 10% or less). In some embodiments, a device has a buffer layer (e.g., GaN), a base layer grown on the buffer layer, the base layer having an InGaN surface with In>10% and a relaxation degree (wrt the buffer) of at least 50%, an LED structure with an active region on the base layer, the active region having In %>35% and a relaxation degree (wrt the lattice constant of the first material) of less than 20%.

A number of embodiments have been described. Other embodiments are in the following claims.

What is claimed is:

1. A method of forming an LED emitter, the method comprising:
   providing a III-nitride layer on a substrate and having a planar top surface;
   selectively epitaxially growing, on each of a plurality of lateral growth regions that are discrete on the planar top surface, a base region comprising an In(x)Ga(1-x)N material extending in a direction perpendicular to the planar top surface;
   providing surfaces of the In(x)Ga(1-x)N material on portions of the base regions, the surfaces of the In(x)Ga(1-x)N material having a relaxed strain, the surfaces of the In(x)Ga(1-x)N material having a base lattice constant within 0.1% of a bulk relaxed value; and
   epitaxially growing LED regions on the surfaces, the LED regions comprising light-emitting layers of In(y_1)Ga(1-y_1)N material that are pseudomorphic with the surfaces of the In(x)Ga(1-x)N material, and having an active region lattice constant within 0.1% of the base lattice constant,
   wherein $0.05<x<0.15$ and $y>0.2$, and
   wherein the base regions and LED regions form mesas, and a surface of each mesa opposite the planar top surface has a lateral dimension that is smaller than a lateral dimension of the lateral growth region.

2. The method of claim 1, wherein the In(x)Ga(1-x)N material relaxes during the growth of the base region.

3. The method of claim 2, wherein the relaxation is facilitated by a lateral expansion of the In(x)Ga(1-x)N material in a direction parallel to the planar top surface.

4. The method of claim 2, wherein the relaxation is facilitated by a formation of defects in the base region.

5. The method of claim 4, wherein the defects are suppressed during subsequent growth on the base region.

6. The method of claim 2, wherein the relaxation is facilitated by varying an In composition of the base regions along a direction normal to the planar top surface.

7. The method of claim 1, wherein relaxation begins before 1 μm of base region material is grown.

8. The method of claim 1, wherein the epitaxial growth of the LED regions promotes a reduction of lateral dimensions of the LED regions above lateral growth regions.

9. The method of claim 1, wherein the mesas include slanted sidewalls.

10. The method of claim 9, wherein the slanted sidewalls correspond to semi-polar facets.

11. The method of claim 1, further comprising depositing a material on sidewalls of the mesas after epitaxial steps to passivate the mesas.

12. The method of claim 1, wherein the light-emitting region has total area comprising a central area corresponding to a central region and a peripheral area corresponding to a peripheral region, wherein the peripheral area is 10% or more of the total area and, during operation of the LED emitter, 5% or less of a light emitted by the active region originates from the peripheral region.

13. The method of claim 12, wherein the active region has a higher In composition in the central region than in the peripheral region, by at least 1% In.

14. The method of claim 1, wherein the lateral growth regions are first lateral growth regions and the method further comprises:

forming discrete second lateral growth regions on the planar top surface;

epitaxially growing second base regions on the second lateral growth regions;

epitaxially growing, on corresponding surfaces of the second base regions, second LED regions comprising light-emitting layers of $In(y_2)Ga(1-y_2)N$ material;

forming discrete third lateral growth regions on the planar top surface;

epitaxially growing third base regions on the third lateral growth regions;

epitaxially growing, on corresponding surfaces of the third base regions, third LED regions comprising light-emitting layers of $In(y_3)Ga(1-y_3)N$ material, wherein $y_1>y_2>y_3$, and the first, second and third LED regions respectively emit red, green, and blue light during operation.

15. The method of claim 14, wherein at least one red, green, and blue-emitting LED form a pixel of a display.

16. The method of claim 14, wherein the corresponding surfaces of the first, second, and third base regions have in-plane lattice constants $a_1$, $a_2$, and $a_3$, respectively, with $a_1>a_2>a_3$.

17. The method of claim 16, wherein the first, second and third LED regions are grown in a same epitaxial step.

18. The method of claim 14, wherein a composition of the base regions are configured such that, during operation of the LED emitter, 10% or less of a blue light emitted by the third LED regions is absorbed by the base region.

19. The method of claim 1, wherein the relaxed strain is a relaxed misfit strain, whose value is less than 50% of a misfit strain for $In(x)Ga(1-x)N$ grown pseudomorphically on GaN.

20. The method of claim 1, wherein the epitaxial growth of the base regions and the epitaxial growth of the LED region occur in separate epitaxial steps, with the surfaces of the $In(x)Ga(1-x)N$ material are regrowth interfaces.

21. The method of claim 1, wherein the base region includes separate base regions.

22. The method of claim 1, wherein the base region includes discrete base regions.

* * * * *